United States Patent
Zhu

(10) Patent No.: US 7,640,521 B2
(45) Date of Patent: Dec. 29, 2009

(54) MODEL VERIFICATION SUPPORT METHOD, APPARATUS, AND COMPUTER-READABLE RECORDING MEDIUM STORING PROGRAM

(75) Inventor: Qiang Zhu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 254 days.

(21) Appl. No.: 11/645,715

(22) Filed: Dec. 27, 2006

(65) Prior Publication Data

US 2007/0106490 A1    May 10, 2007

Related U.S. Application Data

(63) Continuation of application No. PCT/JP2004/009340, filed on Jul. 1, 2004.

(51) Int. Cl.
  *G06F 17/50* (2006.01)
  *G06F 9/45* (2006.01)
  *G06F 17/10* (2006.01)
(52) U.S. Cl. .............. 716/5; 716/1; 716/4; 716/6; 716/18; 703/2; 703/18; 703/22
(58) Field of Classification Search .............. 716/1, 716/2, 4–6, 18; 703/2, 18, 22
  See application file for complete search history.

(56) References Cited

U.S. PATENT DOCUMENTS

| | | | | |
|---|---|---|---|---|
| 6,789,054 | B1 * | 9/2004 | Makhlouf | 703/6 |
| 7,085,688 | B1 * | 8/2006 | Sumida et al. | 703/2 |
| 7,165,236 | B2 * | 1/2007 | America | 717/102 |
| 7,234,126 | B2 * | 6/2007 | Catthoor et al. | 716/18 |
| 7,257,521 | B2 * | 8/2007 | Hashima et al. | 703/7 |
| 7,260,510 | B2 * | 8/2007 | Sumida | 703/2 |
| 7,325,010 | B1 * | 1/2008 | Kim | 707/104.1 |
| 7,356,786 | B2 * | 4/2008 | Schubert et al. | 716/4 |
| 7,389,208 | B1 * | 6/2008 | Solinsky | 703/2 |
| 2005/0192787 | A1 * | 9/2005 | Kuwahara et al. | 703/18 |

(Continued)

FOREIGN PATENT DOCUMENTS

JP    2002-279011    9/2002

(Continued)

OTHER PUBLICATIONS

Randic et al.; "Information modeling of power substations by using the unified modeling language"; May 29-31, 2000; Electrotechnical Conference, 2000. MELECON 2000. 10th Mediterranean; vol. 3, pp. 995-998 vol. 3.*

(Continued)

*Primary Examiner*—Helen Rossoshek
(74) *Attorney, Agent, or Firm*—Staas & Halsey LLP

(57) ABSTRACT

A verification supporting apparatus includes a concept model generating unit, a function model verifying unit, a motion model verifying unit, and an ICA model verifying unit. The concept model generating unit generates a concept model aiming at a requirement specification of a customer to eliminate an error or misunderstanding of the specification at the initial stage of design. The function model verifying unit verifies a concurrent and parallel function model, to verify appropriateness of function module division and correctness of concurrence and parallelism. The motion model verifying unit verifies a motion model, to verify whether the design of architecture is appropriate and whether performance requirements are satisfied. The ICA model verifying unit verifies correctness of interface design.

9 Claims, 33 Drawing Sheets

U.S. PATENT DOCUMENTS

2006/0236289 A1* 10/2006 Zhu et al. .................... 716/11
2007/0016395 A1* 1/2007 Kiffmeier et al. ............. 703/22
2007/0261012 A1* 11/2007 Matsuda et al. ................ 716/4

FOREIGN PATENT DOCUMENTS

| JP | 2003-288378 | | 10/2003 |
|----|-------------|---|---------|
| JP | 2005242642 A | * | 9/2005 |

OTHER PUBLICATIONS

Grosu et al.: "Automated software engineering using concurrent class machines"; Nov. 26-29, 2001; Automated Software Engineering, 2001. (ASE 2001). Proceedings. 16th Annual International Conference on; pp. 297-304.*

Ohst et al.; "Difference tools for analysis and design documents"; Sep. 22-26, 2003; Software Maintenance, 2003. ICSM 2003. Proceedings. International Conference on; pp. 13-22.*

International Search Report; International Application No. PCT/JP2004/009340; Search Report mailed Aug. 30, 2004.

PCT International Preliminary Report on Patentability, mailed Feb. 8, 2007, and issued in corresponding International Application No. PCT/JP2004/009340.

Supplemental European Search Report mailed Jul. 23, 2009 in corresponding European Application No. 04746809,5.

McUmber et al., "UML-Based Analysis Of Embedded Systems Using A Mapping to VHDL", High-Assurance Systems Engineering, 1999 Proceedings, 4$^{th}$ IEEE Intern. Symposium, Wash., D.C., Nov. 17, 2009, pp. 56-63.

Voros et al., "Embedded System Using Formal Model Refinement: an Approach Based on the Combined Use of UML and the B Language", Design Automation for Embedded Systems Journal, Jun. 1, 2004, vol. 9, pp. 67-99.

Theissinger et al., "CASTLE: An Interactive Environment for HW-SW Co-design", Hardware/Software Codesign, 1994 Proceedings, Sep. 22, 1994, pp. 203-209.

References AA (US 2002/0124085 A1), AG (JP 2003-288378) and AH (JP 2002-279011) are cited on the attached International Search Report (International Application No. PCT/JP2004/009340, Search Report mailed Aug. 31, 2004).

* cited by examiner

FIG.18

```
class ECC_SIO{
public :
    void init();
    ECC_SIO();
    ~ECC_SIO();
    ECC_SIO(CPU_M*  cpu , Sender* sender);
    void input(Packet packet);
    void recv(ReceivedPacket recv_p);
    ...
private :
    ERR_TYPE   err_status ;
    bool is_sending_flag ;
    bool is_recving_flag ;

CPU_M* cpu_m ;
    BCH* bch_codec ;
    ...
};
// IMPLEMENTATION OF INITIALIZATION
void ECC_SIO::init() {
    is_sending_flag  = false;
    is_recving_flag  = false;
}
```

FIG.19

| VERIFICATION NO. | USE CASE TO BE VERIFIED | SEQUENCE | RECEIVE PACKET | NUMBER OF PACKETS RECEIVED | NUMBER OF ERROR BITS | CHECK ITEM | RESULTS |
|---|---|---|---|---|---|---|---|
| 0 | RECEIVE PACKET | BASIC PATH | RANDOM | 10 | 0 | NUMBER OF PACKETS RECEIVED BY CPU | |
| 1 | | | | | | DECODE PACKET | |
| 2 | | | | | | CPU ERROR STATE | |
| 3 | | | | | 1 | NUMBER OF PACKETS RECEIVED BY CPU | |
| 4 | | | | | | DECODE PACKET | |
| 5 | | | | | | CPU ERROR STATE | |
| 6 | | | | | 2 | NUMBER OF PACKETS RECEIVED BY CPU | |
| 7 | | | | | | DECODE PACKET | |
| 8 | | | | | | CPU ERROR STATE | |

1900

```
bool test_basic_flow(CPU_M* cpu_m,
                     Sender* sender,
                     ECC_SIO* ecc_sio){
 //1.0. INITIALIZE CPU
 cpu_m->init();
 //1.1. INITIALIZE SENDER
 sender->init();
 //1.2. PREPARE PACKET
 Packet packet = cpu_m->create_packet(2);
 ...
  return true
}
```

FIG.28

|  | *sc_module*<br>Top |
|---|---|
| + packet_i : sc_fifo_in <Packet><br>+ packet_o : sc_fifo_out <Packet><br>+ error_o : sc_fifo_out <ERR_TYPE><br>+ encoded_packet_o : sc_fifo_out <EncodedPacket><br>+ received_packet_i : sc_fifo_in <ReceivedPacket><br>- controller_packet : BusChannel <Packet><br>- status: BusChannel <bool><br>- decoder_packet : BusChannel <Packet><br>- decoder_error : BusChannel <ERR_TYPE><br>- bus: Bus<br>- encoder: MdEncoder<br>- decoder: MdDecoder<br>- clk : sc_clock | |
| + SC_CTOR(Top) | |

FIG.29

ESTIMATED PROCESSING TIME OF EACH MODULE 2900

| MODULE NAME | ESTIMATED PROCESSING TIME |
|---|---|
| Decoder | 600 ns |
| Encoder | 600 ns |

2902

```
....

void   MdEncoder ::main()
{
  while(true){
    Packet packet = packet_i->read();

std::cout << name() << ": received packet.\n";

// ENCODE
    EncodedPacket encoded;
    codec.encode(packet, encoded);
2901→    wait(600, SC_NS);
    // (2)  packet_o WRITE RESULTS TO PORT
    packet_o->write(encoded);
    std::cout<< name() << ": sent packet\ n";
    status_o - >write(true);
  }
}
```

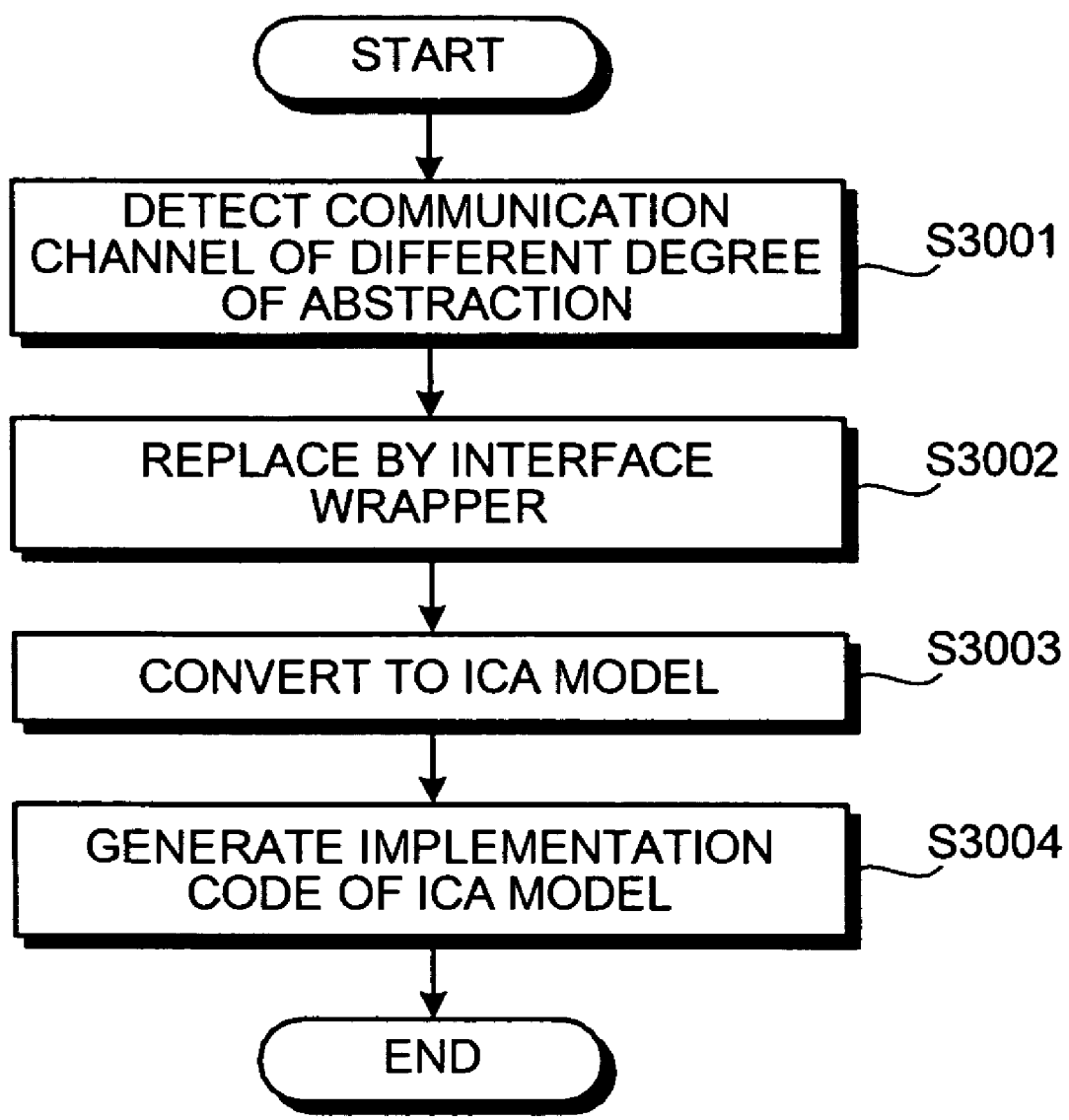

```
SC_MODULE( MdControllerICA ) { sc_in < bool > CLK ;
  sc_in < bool > RESETN ;

// CPU
  sc_port < sc_fifo_in_if<Packet>   > cpu_packet_i ;
  sc_port < sc_fifo_out_if<Packet>  > cpu_packet_o ;
  sc_port < sc_fifo_out_if<ERR_TYPE> > error_o ;

// Encoder
  sc_out < bool >        ENB_o ;
  sc_out < ls_data_type > DAT_o ;
  sc_in  < bool >        BSY_i ;

// Decoder
  sc_port < sc_fifo_in_if<Packet>    > decoder_packet_i ;
  sc_port < sc_fifo_in_if<ERR_TYPE>  > decoder_error_i ;

// FUNCTION MODEL
  MdController MdCtrl ;

// REPLACE BASIC CHANNEL BY WRAPPER AND TRANSACTION
  //    -controller_packet => CtrlSendPacketWrap + LocalParaSendTrans
  //    -status            => CtrlRecvStatusWrap + LocalParaSendTrans
  CtrlSendPacketWrap packet_wrap ;
  CtrlRecvStatusWrap status_wrap ;

LocalParaSendTrans<ls_data_type, ls_len > local_para;

SC_CTOR(MdControllerICA) :
```

MODEL VERIFICATION SUPPORT METHOD, APPARATUS, AND COMPUTER-READABLE RECORDING MEDIUM STORING PROGRAM

This application is a continuing application, filed under 35 U.S.C. §111(a), of International Application PCT/JP2004/009340, filed Jul, 1, 2004, the contents of which are incorporated herein by reference.

BACKGROUND OF THE INVENTION

1. Field of the Invention

The present invention relates to a technology for supporting verification of a large-scale integration (LSI).

2. Description of the Related Art

In LSI design, a verification work of verifying whether an LSI works normally is essential. While the verification work is important to maintain high quality especially for the LSI for which a larger scale, a high performance, a higher speed, and lower power consumption are required, enhanced work efficiency by shortening a design period has conventionally been demanded.

Especially in recent years, software and hardware are implemented on a single LSI and a system on chip (SoC) including not only conventional single-function hardware with an application specific integrated circuit (ASIC) but also software is now a mainstream of LSI. Moreover, since the functions conventionally realized by application software such as moving picture experts group (MPEG) and joint photographic experts group (JPEG) are now realized by hardware, functions of LSI are becoming complicated.

FIG. 38 is a flowchart of a conventional LSI development process. In FIG. 38, steps S3801 to S38805 are a design flow and steps S3806 to S3809 are a verification flow of verifying designed LSI.

In the design flow, a conceptual designing is made at step S3801. In the conceptual designing, a designer prepares a requirement specification 3810 in natural language based on a design request from a customer or receives the requirement specification 3810 described in natural language from the customer.

Functional designing is made at step S3802. In the functional designing, based on described contents of the requirement specification 3810, an LSI to be designed is divided into functional blocks and a functional specification 3820 describing contents of each functional black is prepared.

At step S3803, structural designing is conducted. In the structural designing, based on the functional specification 3820, hardware designing is carried out and a structural specification 3830 is prepared. Specifically, the structural designing is the designing to find out what kind of architecture should be introduced to realize the functions described in the functional specification 3820.

For example, out of functional blocks, architecture of a functional block is realized by software, architecture of a functional block is realized by purchasing intellectual property (IP), architecture of a functional block is prepared by the designer, and architecture of a functional block is realized by an underbus.

At step S3804, unit designing is conducted. In the unit designing, by dividing each hardware module described in the structural specification 3830 into a plurality of modules and by detail-designing of such modules, a unit specification 3840 is prepared.

At step S3805, implementation is conducted. Implementation is conducted using a timing chart of an interface and using a hardware description language (HDL) of a register transfer level (RTL) 3850 to be ultimately designed, considering internal logics.

At step S3806, unit verification is conducted. In the unit verification, the verification of the unit specification for each unit designed at the unit designing, namely, debugging, is conducted according to unit verification items 3860.

At step S3807, connection verification is conducted. In the connection verification, interfaces of respective units verified at the unit verification are connected and verification is made as to whether thus interconnected units work normally, according to connection verification At step S3808, function verification is conduced. In the function verification, verification is made as to whether functional requirements of the system to be designed are satisfied, according to function verification items 3880.

Finally, at step S3809, actual machine verification is conducted. In the actual machine verification, LSI is actually implemented on a chip using the RTL 3850 and it is verified whether the LSI actually works. Determination is made as to whether the requirement specification 3810 from the customer satisfies requirement verification items 3890.

In the above design processing, however, verification of LSI (steps S3806 to S3809) can not be made unless the implementation (step S3805) is made.

This leads to a problem that, when an error is made due to an error of the specification, ambiguity of description, or misinterpretation by a designer at any upstream step of the design flow, the error is accumulated at steps subsequent to such step.

In the structural designing, architecture was determined on the desk and there was no method to ascertain its appropriateness. Therefore, an increase in development risk could result in failure of a development project, to the loss of time and manpower spent in the development.

A special simulator (tools from electronic design automation (EDA) vendors such as VCS and NC-Sim) is required for applying simulation to HDL of the RTL 3850, and a slow simulation speed of the simulator leads to problems of decreased verification efficiency and a longer design period. Especially when an LSI to be designed is of a large scale, occasionally the verification work could not be completed within a predetermined period because of a bottleneck of the slow simulation speed.

On the other hand, it is conceivable to increase the simulation speed by introducing an emulator capable of working at a speed thousands times as fast as the simulator, but the emulator is very expensive and increases verification expenses, and it is difficult to build the environment and debugging is difficult at the time of occurrence of a problem, resulting in increased verification period and a longer design period.

SUMMARY OF THE INVENTION

It is an object of the present invention to at least solve the above problems in the conventional technologies.

A verification supporting apparatus according to one aspect of the present invention includes an analytical information receiving unit that receives analytical information indicative of a result of analysis of a requirement specification regarding a large-scale integration of a design object; a concept model generating unit that generates a concept model in which basic functions of the design object are modeled and in which physical architecture of the design object and concept of time are abstracted, based on the analytical information;

a function model generating unit that generates a function model that is modeled by extracting division of modules making up the design object and concurrence and parallelism of divided modules, based on the analytical information; and a function model verifying unit that verifies whether the division of modules and the concurrence and the parallelism in the function model are proper based on the concept model.

A verification support method according to another aspect of the present invention includes receiving analytical information indicative of a result of analysis of a requirement specification regarding a large-scale integration of a design object; generating a concept model in which basic functions of the design object are modeled and in which physical architecture of the design object and concept of time are abstracted, based on the analytical information; generating a function model that is modeled by extracting division of modules making up the design object and concurrence and parallelism of divided modules, based on the analytical information; and verifying whether the division of modules and the concurrence and the parallelism in the function model are proper based on the concept model.

A computer-readable recording medium that stores therein a verification support program according to the above aspect.

The other objects, features, and advantages of the present invention are specifically set forth in or will become apparent from the following detailed description of the invention when read in conjunction with the accompanying drawings.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 18 is an explanatory diagram of implementation code of a concept model

FIG. 19 is an explanatory diagram of verification items of the system LSI including the serial transceiver system;

FIG. 28 is an explanatory diagram of the divided design class diagram in which a description in an attribute is replaced with a bus model description;

FIG. 29 is a schematic diagram for explaining an example of addition of estimated processing time of each module to the implementation code;

FIG. 30 is a flowchart of an implementation code generation process of an interface cycle accurate (ICA) model of the system LSI including the serial transceiver system;

FIG. 34 is a schematic diagram for illustrating an implementation code of an encoder module of an ICA model;

DETAILED DESCRIPTION OF THE PREFERRED EMBODIMENTS

Exemplary embodiments according to the present invention will be explained in detail below with reference to accompanying drawings.

Figure 1:
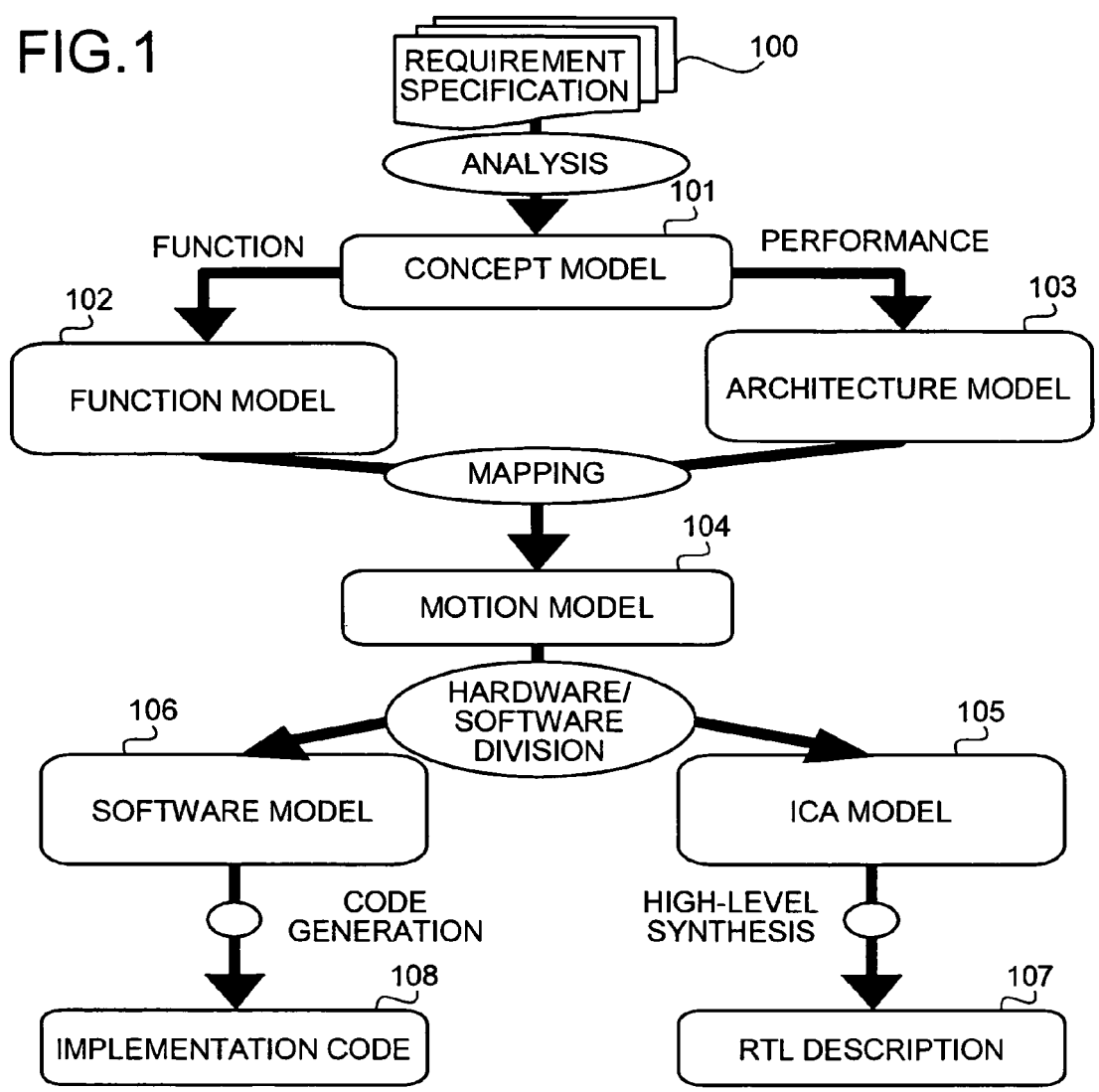
FIG. 1 is a concept view of verification support according to an embodiment of the present invention.

Description will now be made of a concept of a verification support according to the embodiment of the present invention. FIG. 1 is a conceptual illustration of the verification support according to the embodiment of the present invention.

As shown in FIG. 1, a designer applies an object-oriented analysis using unified modeling language (UML) to a requirement specification 100 from a customer of a system LSI including an object of design and performs modeling of results of analysis thereof as a concept model 101. The concept model 101 is a model representing the results of conceptual analysis of the object of design. The concept model 101 is a model entirely independent of implementation and specifically, is a model that has physical architecture and concept of time abstracted and is made by modeling with the center on basic functions of the object of design.

Specifically, the concept model 101 is a product as a result of modeling in UML or C++ of the results of analysis of the requirement specification for the system LSI, and is a general term for all of a UML model, a C++ model, and a verification scenario. Misunderstanding or error of the requirement specification, or algorithm, can be verified by the concept model 101.

A function model 102 is a model built by extracting division of modules making up the system LSI and the concurrence and parallelism of the divided modules from the concept model 101. Concept of time is not present in the function model 102. Properness of module division and accuracy of the concurrence and parallelism can be verified by the function model 102.

An architecture model 103 is a model representing physical hardware parts of existing design such as bus and IP. Specifically, the architecture model 103 is broadly classified into a processing resource and a communication resource. The processing resource is a model for mapping the modules of the function model 102. A hardware processing module, a processor, a real-time operating system (RTOS), and a digital signal processor (DSP) can be cited as an example.

On the other hand, the communication resource is a model made by modeling a channel to realize the communication between modules of the function model. Buses, memories, and signal lines between hardware modules, etc., can be cited as an example. Since the architecture model 103 uses existing hardware parts, verification is not required with respect to the architecture model 103.

Conceptually, a motion model 104 is a product as a result of mapping the function model 102 to the architecture model 102. Specifically, processes of the function model 102 are mapped to the processing resource of the architecture model 103, and the communication channel of the function model 103 is assembled using the communication resource. In the motion model 104, verification can be made as to whether the motion (performance) requested by the customer is satisfied.

The motion model 104 is divided into hardware and software, and an ICA model 105 representing a hardware implementation and a software model 106 representing a software implementation are generated.

The ICA model 105 is a model built by cycle accuracy with respect to interfaces outside modules, and by motion level with respect to the inside of modules. By a high-level synthesis of the ICA model 105, RTL description 107 is generated. At the ICA model 105, accuracy of the interface can be verified.

The software model 106 is a model that carries out a task division of software making up the system LSI including the object of design and executes the tasks on virtual operation system (OS). By applying the code generation processing to the software model 106, implementation codes are generated. At the software model 106, functions of the software can be verified.

Figure 2:
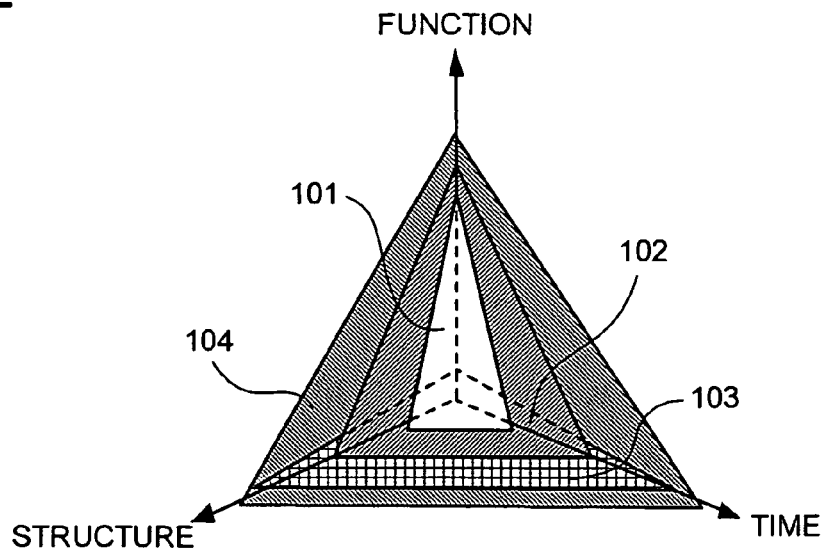
FIG. 2 is a graph of a degree of abstraction of each model shown in FIG. 1.

Description will then be made of a degree of abstraction of each model shown in FIG. 1. FIG. 2 is a graph of the degree of abstraction of models 101 to 106 shown in FIG. 1. The graph of FIG. 2 is composed of three axes extending from an original point, which represent the degree of abstraction of "function", "structure", and "time", respectively and the degree of abstraction becomes higher as the distance from the original point becomes larger.

Figure 3:
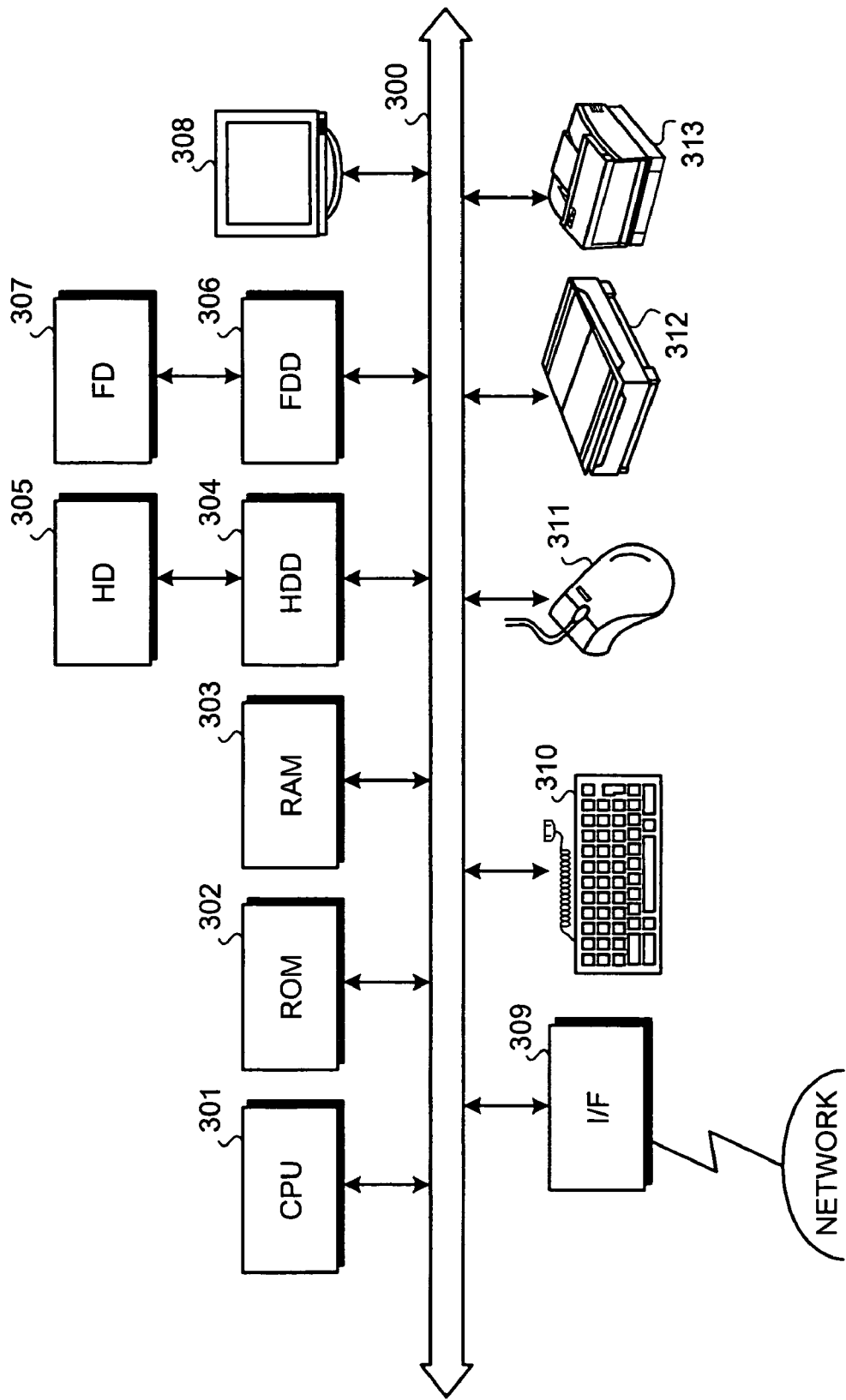
FIG. 3 is a schematic diagram of a verification supporting apparatus according to the embodiment.

FIG. 3 is a schematic diagram of a verification supporting apparatus according to the embodiment. As shown in FIG. 3, the verification supporting apparatus includes a CPU 301, a read-only memory (ROM) 302, a random-access memory (RAM) 303, a hard disk drive (HDD) 304, a hard disk (HD) 305, a flexible disk drive (FDD) 306, a flexible disk (FD) 307 as an example of a removable recording medium, a display 308, and an interface (I/F) 309, a keyboard 310, a mouse 311, a scanner 312, and a printer 313. Components are connected to one another by way of a bus 300.

The CPU 301 performs overall control of the verification supporting apparatus. The ROM 302 stores programs such as a boot program. The RAM 303 is used as a work area of the CPU 301. The HDD 304 controls reading and writing of data from and to the HD 305 under control of the CPU 301. The HD 305 stores the data written under control of the HDD 304.

The FDD 306 controls reading and writing of data from and to the FD 307 under control of the CPU 301. The FD 307 stores the data written under control of the FDD 306 and allows the verification supporting apparatus to read the data stored in the FD 307.

A removal recording medium, besides the FD 307, may be a compact-disc read-only memory (CD-ROM), a compact-disc recordable (CD-R), a compact-disc rewritable (CD-RW), a magneto optical (MO) disk, a digital versatile disk (DVD), or a memory card. The display 308 displays a cursor, an icon, a tool box, and data such as document, image, and function information. The display 308 may be, for example, a cathode ray tube (CRT), a thin-film transistor (TFT) liquid crystal display, or a plasma display panel.

The I/F 309 is connected to a network such as the Internet through a communication line and is connected to other apparatuses by way of the network. The I/F 309 serves as an interface between the network and the inside of the apparatus and controls the input and output of data from or to external apparatuses. The I/F 309 may be, for example, a modem or a local area network (LAN) adaptor.

The keyboard 310 is equipped with keys to input characters, numerals, and various instructions, and data is entered through the keyboard 310. The keyboard 310 may be a touch-panel input pad or a numeric keypad. The mouse 311 performs a cursor movement, a range selection, a movement or size change of a window. The mouse 311 may be a trackball or a joystick that has similar functions as a pointing device.

The scanner 312 optically reads an image and takes in the image data into the verification supporting apparatus. The scanner 312 may have an OCR function as well. The printer 313 prints image data and document data. The printer 313 may be, for example, a laser printer or an ink jet printer.

Figure 4:
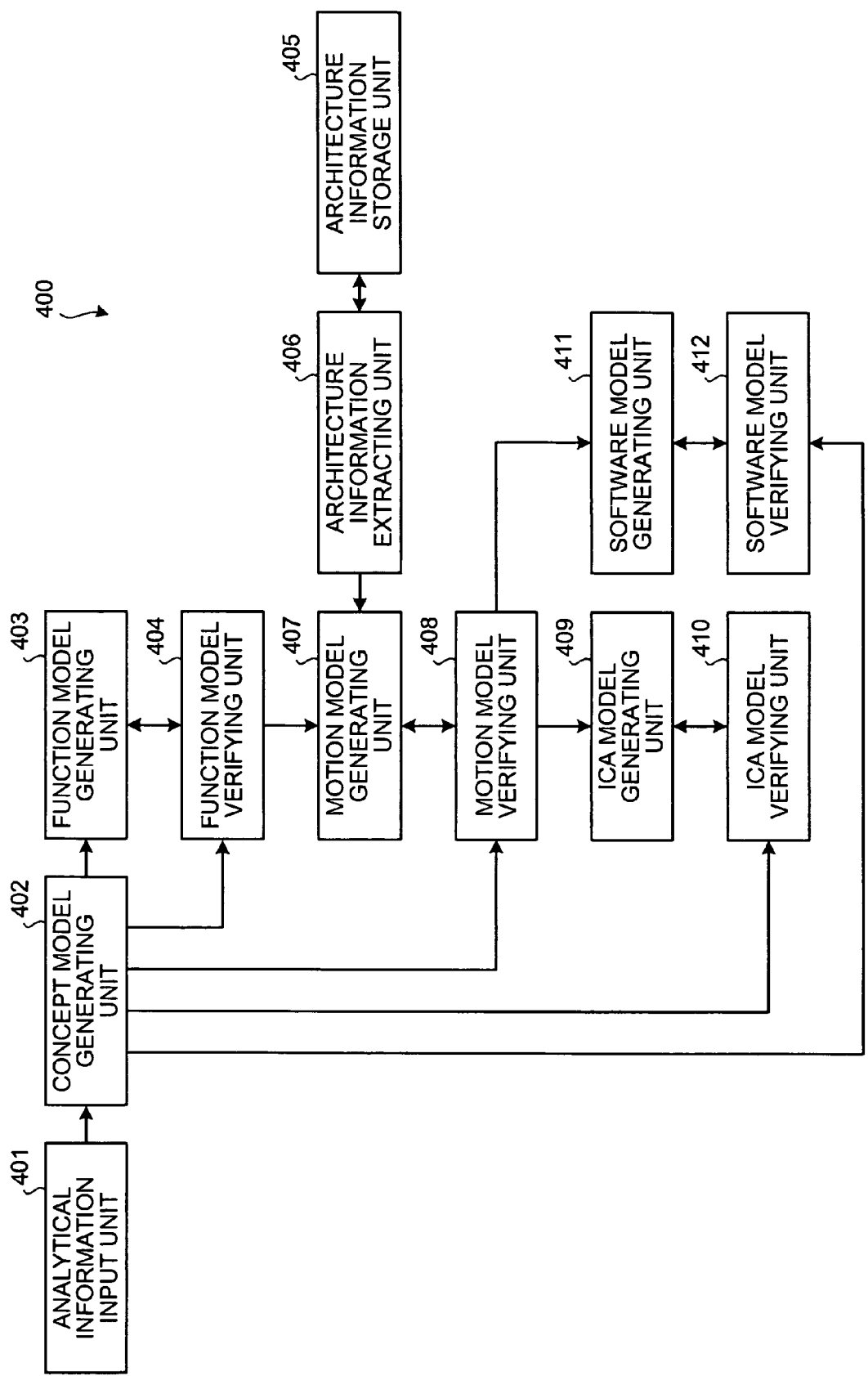
FIG. 4 is a block diagram of the verification supporting apparatus.

FIG. 4 is a block diagram of the verification supporting apparatus. As shown in FIG. 4, a verification supporting apparatus 400 includes an analytical information input unit 401, a concept model generating unit 402, a function model generating unit 403, a function model verifying unit 404, an architecture information storage unit 405, an architecture information extracting unit 406, a motion model generating unit 407, a motion model verifying unit 408, an ICA model generating unit 409, an ICA model verifying unit 410, a software model generating unit 411, and a software model verifying unit 412.

The analytical information input unit 401 accepts an input of information (analytical information) indicative of results of analysis of the requirement specification from a customer of the system LSI including the object of design. The analytical information includes, for example, computer-readable information such as a use case diagram, a sequence diagram, and a class diagram of the object of design described in UML and items of basic functions required of the object of design.

The concept model generating unit 402 generates a concept model in which basic functions of the object of design are modeled and in which physical architecture of the object of design and the concept of time are abstracted, namely, the concept model 101 shown in FIG. 1, based on the analytical information input by the analytical information input unit 401.

Specifically, the concept model generating unit 402, by analyzing the analytical information such as the use case diagram, generates implementation codes of the object of design, items to be verified with the object of design (verification items), and a verification scenario indicative of a procedure of verification processing by circuit simulation. Thus generated implementation codes, verification items and verification scenario constitute the concept model 101 shown in FIG. 1.

The function model generating unit 403 generates a function model that is modeled by extracting division of modules making up the object of design and the concurrency and parallelism of the divided modules, based on the analytical information input by the analytical information input unit 401. The function model generating unit 403, for example, generates a function model representing functions of the object of design, based on a class diagram that is analytical information.

Specifically, the function model generating unit 403 divides the class diagram input to the concept model generating unit 402 into plural parts according to functions and generates implementation codes for each division of the class diagram (divided class diagram). The implementation codes for respective divided class diagrams constitute the function model 102 shown in FIG. 1.

The function model verifying unit 404 verifies whether, with respect to the function model generated by the function model generating unit 403, the division of modules making up the object of design and the concurrence and parallelism of the divided modules are proper, based on the concept model generated by the concept model generating unit 402.

Specifically, properness of the function model is verified by determining whether results of simulation of the implementation codes for each divided class diagram correspond with results of simulation obtained by simulating the implementation codes of the concept model according to the verification scenario of the concept model. The results of simulation as used here refer to what kind of output data can be obtained in response to a certain input data.

More specifically, when the results of simulation of the implementation codes for each divided class diagram correspond with the results of simulation of the implementation codes of the concept model, the function model is determined as proper. On the other hand, if these results of simulation do not match, then the division, the concurrence, and the parallelism of the function model are not proper, and the function model generating unit 403 modifies the implementation codes of the function model.

The architecture information storage unit 405 stores information on physical hardware parts of existing design such as a bus and IP (Intellectual Property). The architecture information storage unit 405 specifically realizes its function by, for example, the ROM 302, the RAM 303, the HD 305, the FD 307, etc.

The architecture information extracting unit 406 extracts the architecture information stored at the architecture information storage unit 405. With respect to the processing resource, for example, the hardware processing module, the processor, the RTOS, the DPS, etc., are extracted. With respect to the communication resource, buses, memories, signal lines between hardware modules, etc., are extracted. The architecture information extracted by the architecture information extracting unit 406 corresponds to the architecture model 103.

The motion model generating unit 407 generates a motion model in which the motion of the object of design is modeled by mapping the information on the architecture extracted by the architecture information extracting unit 406 to the function model verified as proper by the function model verifying unit 404.

Specifically, by mapping the function model 102 to the architecture model 103, the motion model 104 of the object of design is generated. Specifically, the process of the function model 102 is mapped to the processing resource of the architecture model 103 and the communication channel of the function model 102 is assembled using the communication resource. By this assembly, implementation codes taking into consideration the processing time of modules obtained by the mapping are generated. Thus generated implementation codes correspond to the motion model shown in FIG. 1.

The motion model verifying unit 408 verifies whether the motion timing of modules making up the object of design modeled by the motion model generated by the motion model generating unit 407 is proper.

Specifically, the properness of the motion model is verified by determining whether results of simulation of the implementation codes generated by the motion model generating unit 407 correspond with results of simulation obtained by simulating the implementation codes of the concept model according to the verification scenario of the concept model. Results of simulation as used here refer to what kind of output data can be obtained in response to a certain input data.

If these results of simulation correspond, then the motion model is verified as proper and the motion model satisfies the motion (performance) requested by the customer. On the other hand, if these results do not match, then the motion model does not satisfy the motion (performance) requested by the customer. In this case, the motion model generating unit 407 modifies the implementation codes of the motion model.

When the motion model is verified as proper by the motion model verifying unit 408, the ICA model generating unit 409 generates a ICA model by inserting, at the place where a degree of abstraction is different between modules making up the object of design modeled by the function model, an interface of a predetermined clock cycle accuracy between the modules.

Specifically, hardware/software division is applied to the motion model 104, and an ICA model representing the hardware implementation is generated. For example, when the degree of abstraction is different between modules, the communication channel between the modules shown in the class diagram is replaced by an interface wrapper so that the degree of abstraction is equivalent between the modules.

Then, the ICA model generating unit 409 generates implementation codes of the class diagram in which the communication channel has been replaced by the interface wrapper. Thus generated implementation codes constitute the ICA model 105 shown in FIG. 1. By a high-level synthesis of the implementation codes of the ICA model 105, the RTL description 107 can be generated.

The ICA model verifying unit 410 verifies whether the clock cycle accuracy of the interface inserted into the ICA model 105 generated by the ICA model generating unit 409 is proper, based on the concept model 101 generated by the concept model generating unit 402.

Specifically, the ICA model verifying unit 410 verifies the properness of the ICA model by determining whether results of simulation of implementation codes generated by the ICA model generating unit 409 correspond with results of simulation obtained by simulating the implementation codes of the concept model according to the verification scenario of the concept model. The results of simulation as used here refer to what kind of output data can be obtained in response to a certain input data.

If these results match, then the ICA model is verified as proper. Specifically, it is verified that the interface represented by the interface wrapper that has replaced the communication channel is accurate. On the other hand, if these results do not match, then the interface wrapper is not accurate. In this case, the ICA model generating unit 409 modifies the implementation codes of the ICA model.

When the motion model is verified as proper by the motion model verifying unit 408, the software model generating unit 411 generates a software model that is modeled to include tasks executable by software, based on the object of design modeled by the function model.

Specifically, hardware/software division is applied to the motion model 104, and a software model 106 (see FIG. 1) representing the software implementation is generated. For example, a task division of the software making up the system LSI including the object of design is carried out and implementation codes executable on a virtual OS are generated.

The software model verifying unit 412 verifies whether tasks included in the software model generated by the software model generating unit 411 are proper, based on the concept model generated by the concept model generating unit 402.

Specifically, the software model verifying unit 412 verifies the properness of the software model 106 by determining whether results of simulation of implementation codes generated by the software model generating unit 411 correspond with results of simulation obtained by simulating the implementation codes of the concept model according to the verification scenario of the concept model. The results of simulation as used here refer to what kind of output data can be obtained in response to a certain input data.

If these results match, then the functions represented by the implementation codes of the software model 106 are verified as proper, and implementation codes 108 (see FIG. 1) of the object of design as a whole are generated that incorporate the implementation codes of the software model 106. On the other hand, if these results do not match, then the functions represented by the implementation codes of the software model 106 are not accurate. In this case, the software model generating unit 411 modifies the implementation codes of the software model.

Functions of the analytical information input unit 401, the concept model generating unit 402, the function model generating unit 403, the function model verifying unit 404, the architecture information extracting unit 406, the motion model generating unit 407, the motion model verifying unit 408, the ICA model generating unit 409, the ICA model verifying unit 410, the software model generating unit 411, and the software model verifying unit 412, mentioned above, are realized by the CPU 301 executing the program recorded on, for example, the ROM 302, the RAM 303, the HD 305, the FD 307, etc., shown in FIG. 3 or by the I/F 309.

Figure 5:
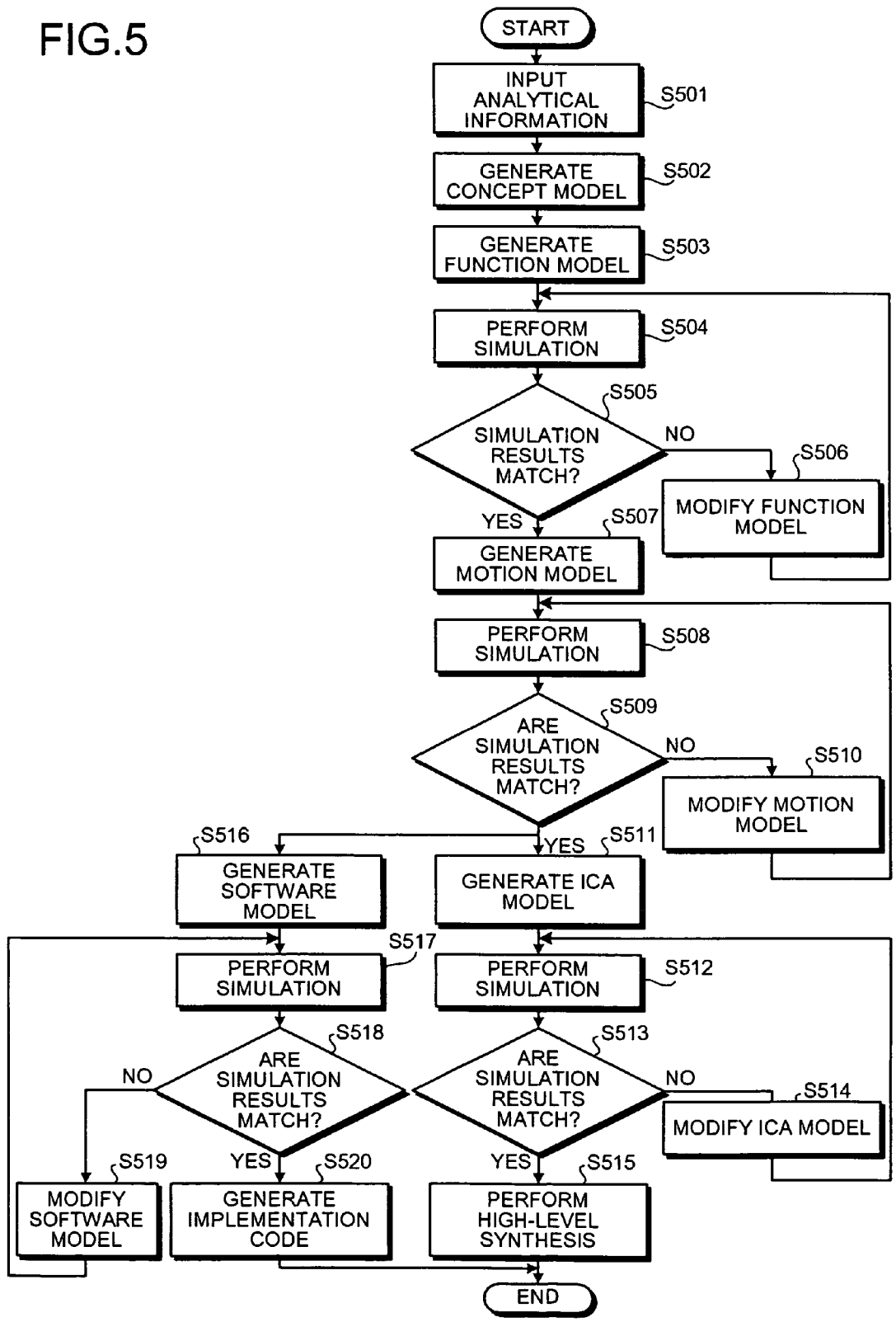
FIG. 5 is a flowchart of a verification support process performed by the verification supporting apparatus.

FIG. 5 is a flowchart of the verification support process performed by the verification supporting apparatus. As shown in FIG. 5, the designer analyzes the requirement specification from the customer of the system LSI including the object of design and inputs the analytical information representing results of the analysis (step S501).

Based on the input analytical information, the concept model 101 is generated that includes the implementation codes of the object of design, the items to be verified with the object of design (verification items), and the verification scenario representing the procedure of verification processing by circuit simulation (step S502). The properness of the generated concept model 101 is verified by the designer.

The function model 102 of the object of design is generated (step S503). Specifically, the class diagram input to the concept model generating unit 402 is divided into plural parts according to functions and implementation codes are generated for each division of the class diagram (divided class diagram).

Simulation is made of the implementation codes of the concept model 101 and the implementation codes of the function model 102 (step S504). Then, determination is made as to whether results of the simulation of the implementation codes of the concept model 101 and results of the simulation of the implementation codes of the function model 102 correspond, namely, the function model verification is performed (step S505).

If these results do not match (step S505: NO), then the function model 102 is modified (step S506). Specifically, for example, the class diagram of the concept model 101 is re-divided, and divided class diagrams are generated, and implementation codes are generated for each divided class diagram. Then, the process goes to step S504.

On the other hand, if these results match (step S505: YES), then the function model is determined as proper, and the motion model 104 is generated by mapping the architecture model 103 to the verified function model 102 whose properness has been verified (step S507). Then, simulation is made of implementation codes of the motion model (step S508).

Next, determination is made as to whether results of the simulation of the implementation codes of the concept model 101 and results of the simulation of the implementation codes of the motion model 104 correspond, namely, the motion model verification is performed (step S509).

If these results do not match (step S509: NO), then the motion model is modified (step S510). Specifically, a motion model 104 is generated, for example, by re-extracting architecture information from the architecture information storage unit 405 and mapping a new architecture model 103 to the verified function model 102 whose properness has been verified. Then, the process goes back to step S508.

On the other hand, if these results match (step S509: YES), then the motion model 104 is determined to be proper. Then, by applying a software/hardware division to the verified motion model 104 whose properness has been verified, the ICA model 105 and the software model 106 are generated (steps S511 and S516).

Simulation is made of implementation codes of the generated ICA model 105 (step S512). Next, determination is made as to whether results of simulation of the implementation codes of the concept model 101 and results of simulation of the implementation codes of the ICA model 105 correspond, namely, ICA model verification is performed (step S513).

If these results do not match (step S513), then the ICA model is modified (step S514). Specifically, by changing, for example, contents of the interface wrapper, the ICA model 105 is modified. Then, the process goes to step S512.

On the other hand, if these results match (step S513: YES), then the ICA model is determined to be proper, and by applying the high-level synthesis (step S515), the RTL description is generated.

Simulation is made of the implementation codes of the generated software model 106 (step S517). Next, determination is made as to whether results of simulation of the implementation codes of the concept model 101 and results of simulation of the implementation codes of the software model 106 correspond, namely, software model verification is performed (step S518).

If these results do not match (step S518: NO), then the software model 106 is modified (step S519). Specifically, for example, by re-applying the task division to the software making up the system LSI including the object of design, implementation codes executable on a virtual OS are generated.

On the other hand, if these results match (step S518: YES), then the software model 106 is determined to be proper, and the implementation codes 108 of the object of design as a whole are generated that incorporate the implementation codes of the verified software model 106 whose properness has been verified (step S520).

According to this procedure of verification process, verification is made step by step, from model to model, and already verified models including the model verified immediately before the current model can be used as effective models without necessity of re-doing the verification. Therefore, repeat of the same process is eliminated in verification processing and enhanced efficiency of the verification processing can be achieved.

While the above flowchart of FIG. 5 specifies that the processing at steps S511 to S515 and the processing at steps S516 to S520 are executed in parallel, the processing at steps S516 to S520 may be executed after the processing at steps S511 to S515, or the processing at steps S511 to S515 may be executed after the processing at steps S516 to S520.

Figure 6:
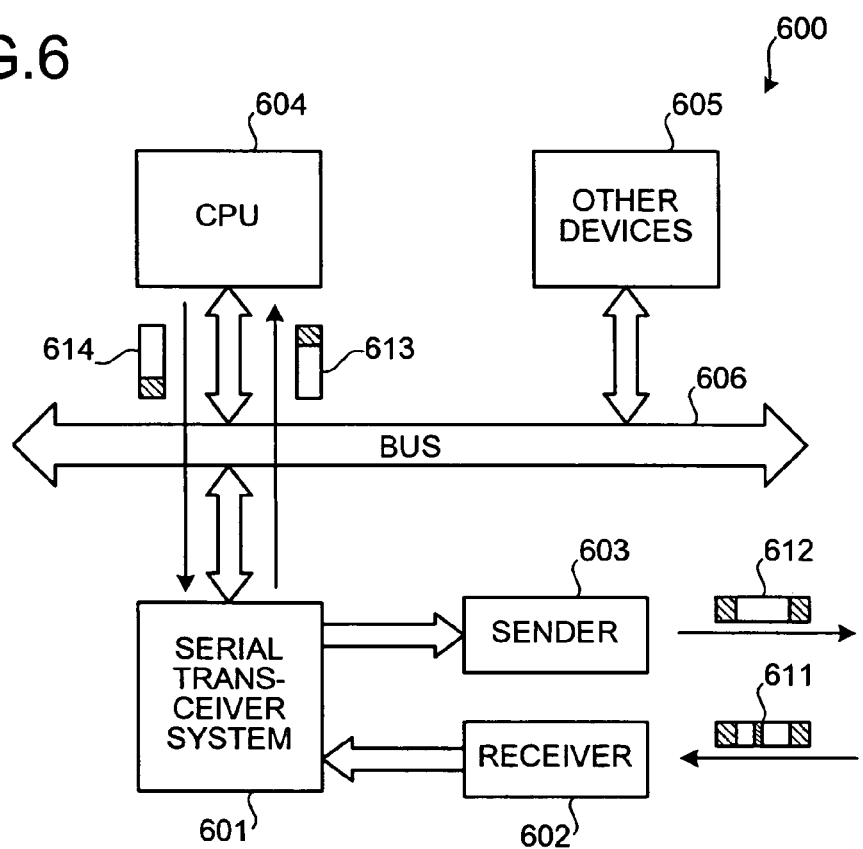
FIG. 6 is a block diagram of a system LSI including an object of design according to the embodiment.

FIG. 6 is a block diagram of the system LSI including the object of design according to the embodiment. This object of design is the information with which a design job from a customer has been undertaken and here, description will be made considering the object of design as a serial transceiver system.

As shown in FIG. 6, the system LSI 600 includes a serial transceiver system 601 as one example of the object of design, a receiver 602, a sender 603, a CPU 604, other devices 605, and a bus 606 interconnecting them.

The receiver 602 receives a receive packet 611 and provide the packet to the serial transceiver system 601. The sender 603 transmits the information provided by the serial transceiver system 601 as a transmit packet 612 to an external apparatus not shown. The serial transceiver system 601 encodes and decodes by, for example, a BCH(62,48).

The serial transceiver system 601 decodes the receive packet 611 from the receiver 602 and provides thus decoded packet 613 to the CPU 604. The serial transceiver system 601 also encodes a packet 614 from the CPU 604. The CPU 604, together with other devices 605, executes functions of the system LSI 600, using the packet 613 from the serial transceiver system 601.

Figure 7:
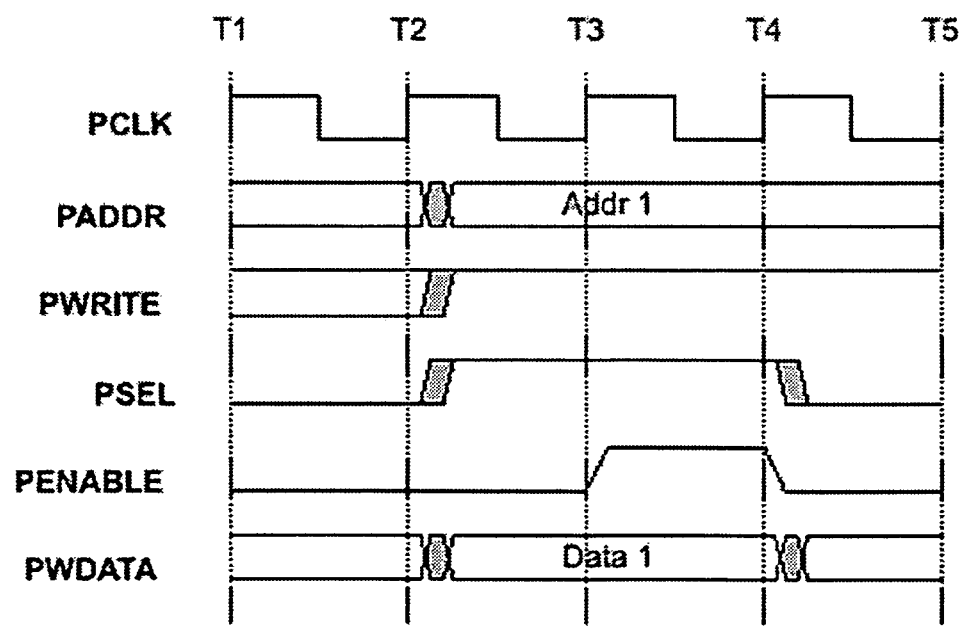
FIG. 7 is a timing chart at writing for explaining specifications of a bus as an interface with external apparatuses.
Figure 8:
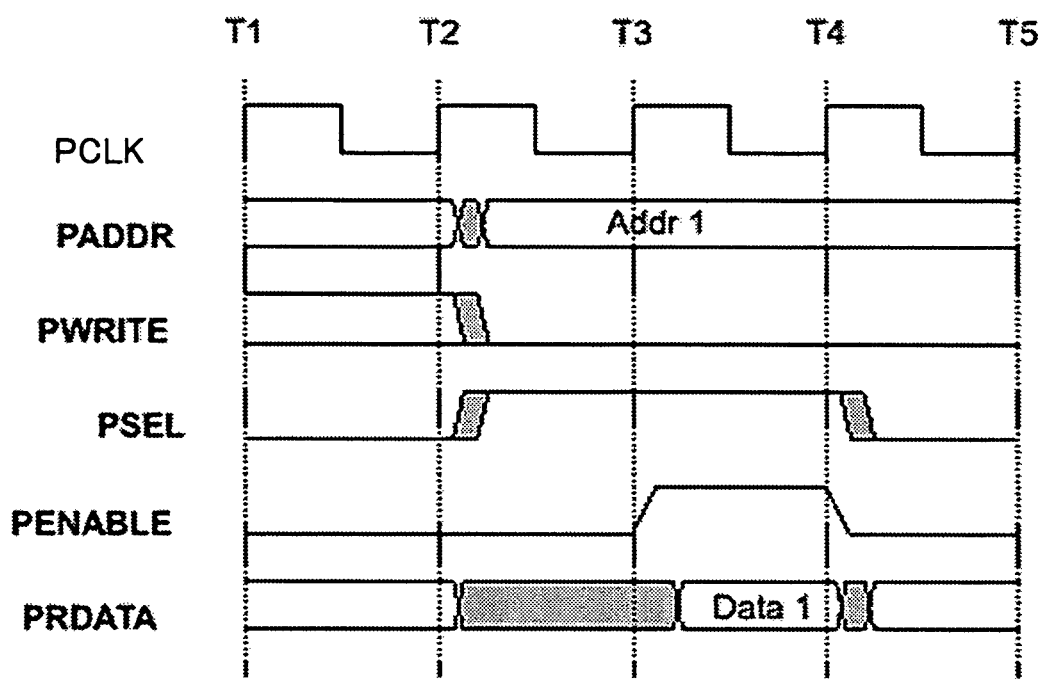
FIG. 8 is a timing chart at reading for explaining specifications of the bus.

Description will then be made of an interface specification of external apparatuses (the receiver 602, the sender 603, the CPU 604, and other devices 605). FIGS. 7 and 8 are schematic diagrams for explaining specifications of the bus as an interface of the external apparatuses. FIG. 7 is a timing chart at writing and FIG. 8 is a timing chart at reading.

In FIGS. 7 and 8, "PCLK" is an input clock signal of 1-bit width. "PADDR" is an address output signal of 32-bit width. "PWRITE" is a read/write control output signal of 1-bit width. "PSEL" is a chip select output signal of 1-bit width. "PENABLE" is an output enable signal of 1-bit width. "PRDATA" is a data input signal of 32-bit width. The specification of the bus with respect to the CPU 604 conforms to a standard protocol of bus, and a built-in processor core is to be employed for the CPU 604.

Figure 9:
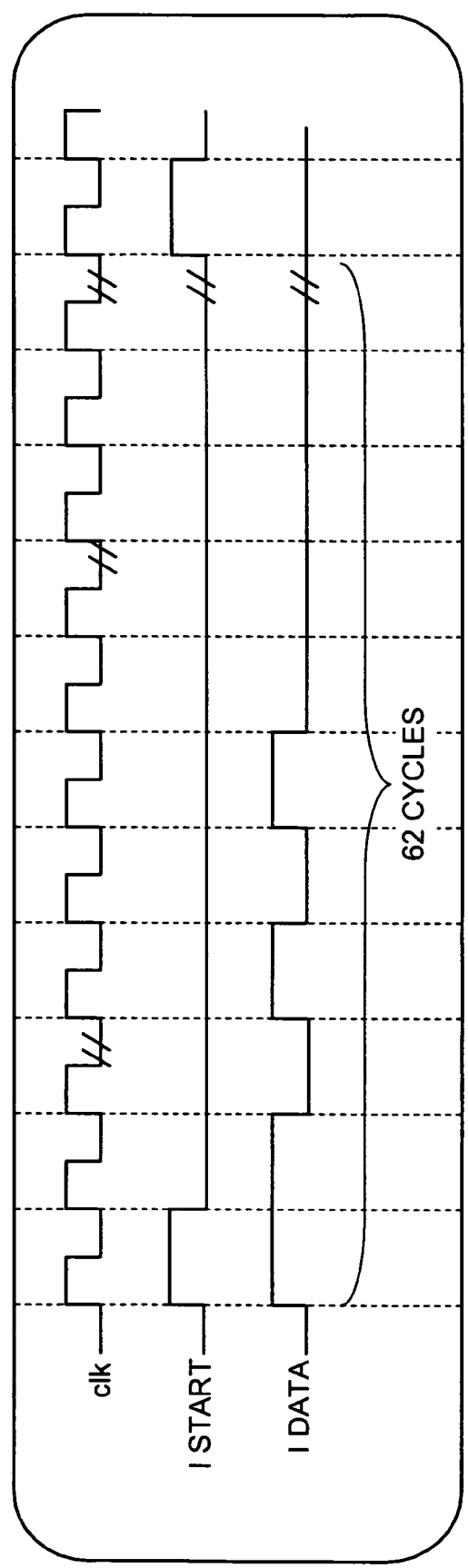
FIG. 9 is a schematic for explaining specifications of a sender as an interface with external apparatuses.

FIG. 9 is a schematic diagram for explaining specifications of the sender 603 as an interface of the external apparatuses. In FIG. 9, "clk" is input clock signal of 1-bit width. "ISTART" is a start pulse input signal of 1-bit width. "IDATA" is a data input signal of 1-bit width. The specification of the input from the serial transceiver system 601 to the sender 603 is so designed that upon detection of an i clock pulse of the start pulse input signal, the sender 603 takes in one bit of data at every positive edge of the clock. Input clock frequency is 100 megahertz (MHz).

Figure 10:
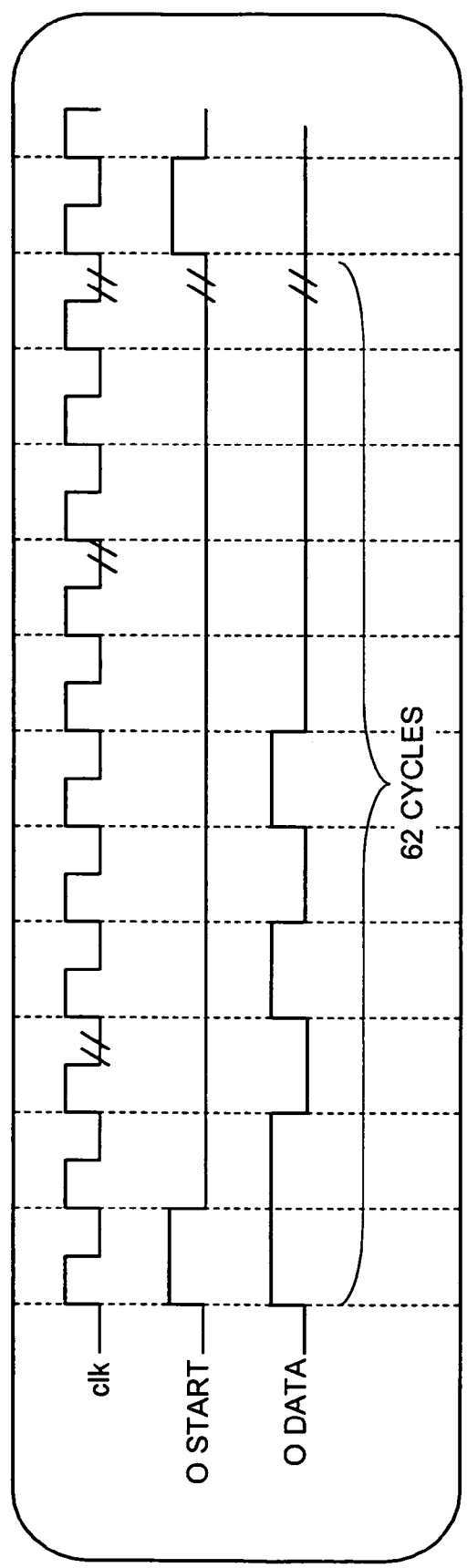
FIG. 10 is a schematic for explaining specifications of a receiver as an interface with external apparatuses.

FIG. 10 is a schematic diagram for explaining specifications of the receiver 602 as an interface of the external apparatuses. In FIG. 10, "clk" is output clock signal of 1-bit width. "OSTART" is a start pulse output signal of 1-bit width. "ODATA" is a data output signal of 1-bit width.

The basic functions required of the serial transceiver system 601 are (1) a packet transmit function, (2) a packet receive function, and (3) an initialize function.

(1) The packet transmit function is as follows:

(i) a transfer function of encoding the packet 614 prepared by the CPU 604 using the BCH(62,48) and transferring the encoded packet to the sender 603

(ii) an error detection function of detecting an error of the packet 614 prepared by the CPU 604 and notifying the CPU 604 of the error (iii) a packet destruction function of notifying the CPU 604 of an error and destroying the transmit packet 612 when a large volume of packet 614 is consecutively transmitted from the CPU 604 and the processing thereof can not be performed timely (vi) output throughput to the sender 603: 0 megabyte per second (Mbps) to 1 Mbps (2) The packet receive function is as follows:

(vii) a decoding function of consecutively receiving the receive packet 611 encoded by the BCH(62,48) from the receiver 602, decoding the receive packet 611 and notifying the CPU 604 thereof, and causing the CPU 604 to receive the decoded packet 613

(viii) a packet destruction permit function of permitting destruction of the receive packet 611 when a large volume of packet 611 is transmitted from the receiver 602 and the processing thereof can not be performed timely (ix) a packet destruction function of notifying the CPU 604 of an error and destroying the receive packet 611 when an error-uncorrectable packet is contained in the receive packet 611

(x) a correction and detection function of being capable of an error correction of up to two bits and an error detection of up to four bits with respect to the receive packet 611

(xi) input throughput from the receiver 602: 0 Mbps to 1 Mbps (3) The initialize function is as follows:

(xii) a soft reset function of initializing as instructed by the CPU 604

Figure 11:
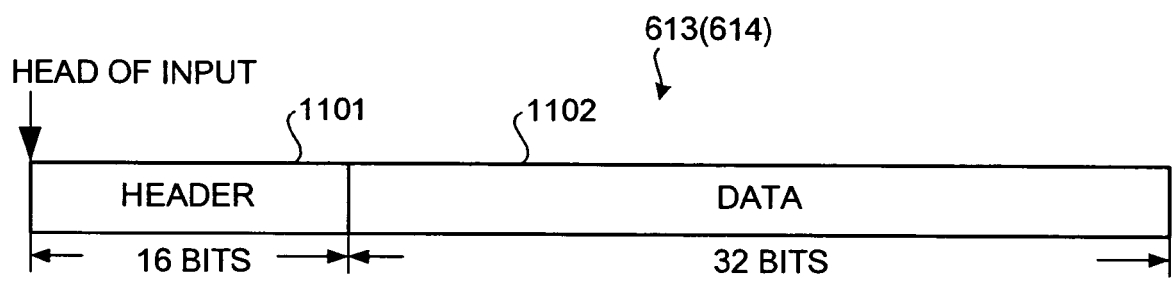
FIG. 11 is a schematic for explaining configuration of a packet transmitted or received by a central processing unit (CPU)
Figure 12:
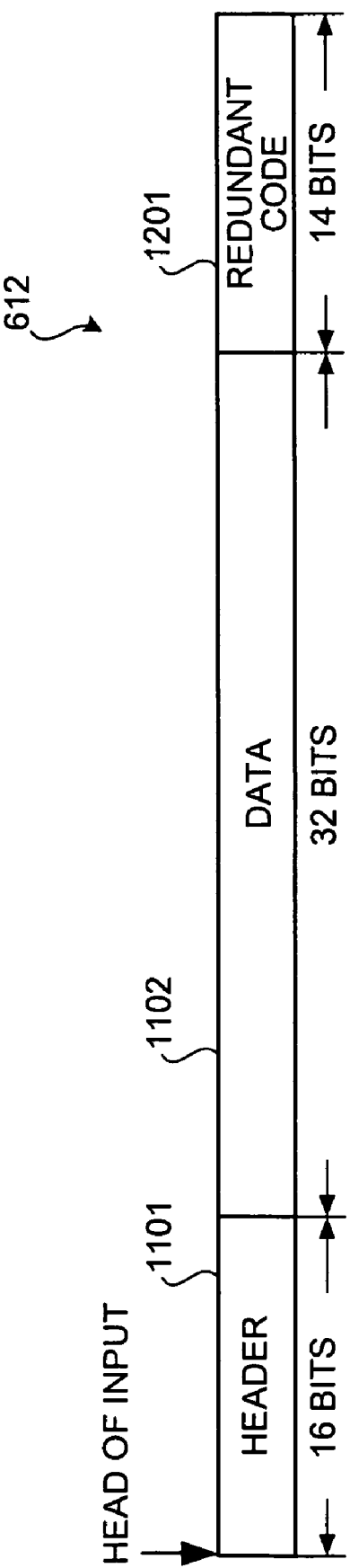
FIG. 12 is a schematic for explaining configuration of a transmit packet.

(xiii) a hard reset function of initializing as instructed by a rest signal as well Description will then be made of the configuration of the packet 613 and the packet 614 received or transmitted by the CPU 604. FIG. 11 is an explanatory diagram of the configuration of the packet 613 and the packet 614 received or transmitted by the CPU 604 and FIG. 12 is an explanatory diagram of the configuration of the transmit packet 612. In FIG. 11, packets 613 and 614 comprise a 16-bit header 1101 and a 32-bit data 1102. The header 1101 is specified as a packet identification number (1010101010101010) 2.

In FIG. 12, the transmit packet 612 is configured to have a 14-bit redundant code 1201 encoded by the BCH(62,48) in addition to the 16-bit header 1101 and the 32-bit data 1102 shown in FIG. 11. The receive packet not shown is so configured that an error bit due to communication channel is further added to the configuration of the transmit packet 612. Contents of the information of FIGS. 6 to 12 constitute the requirement specification 100 required by the customer.

Figure 13:
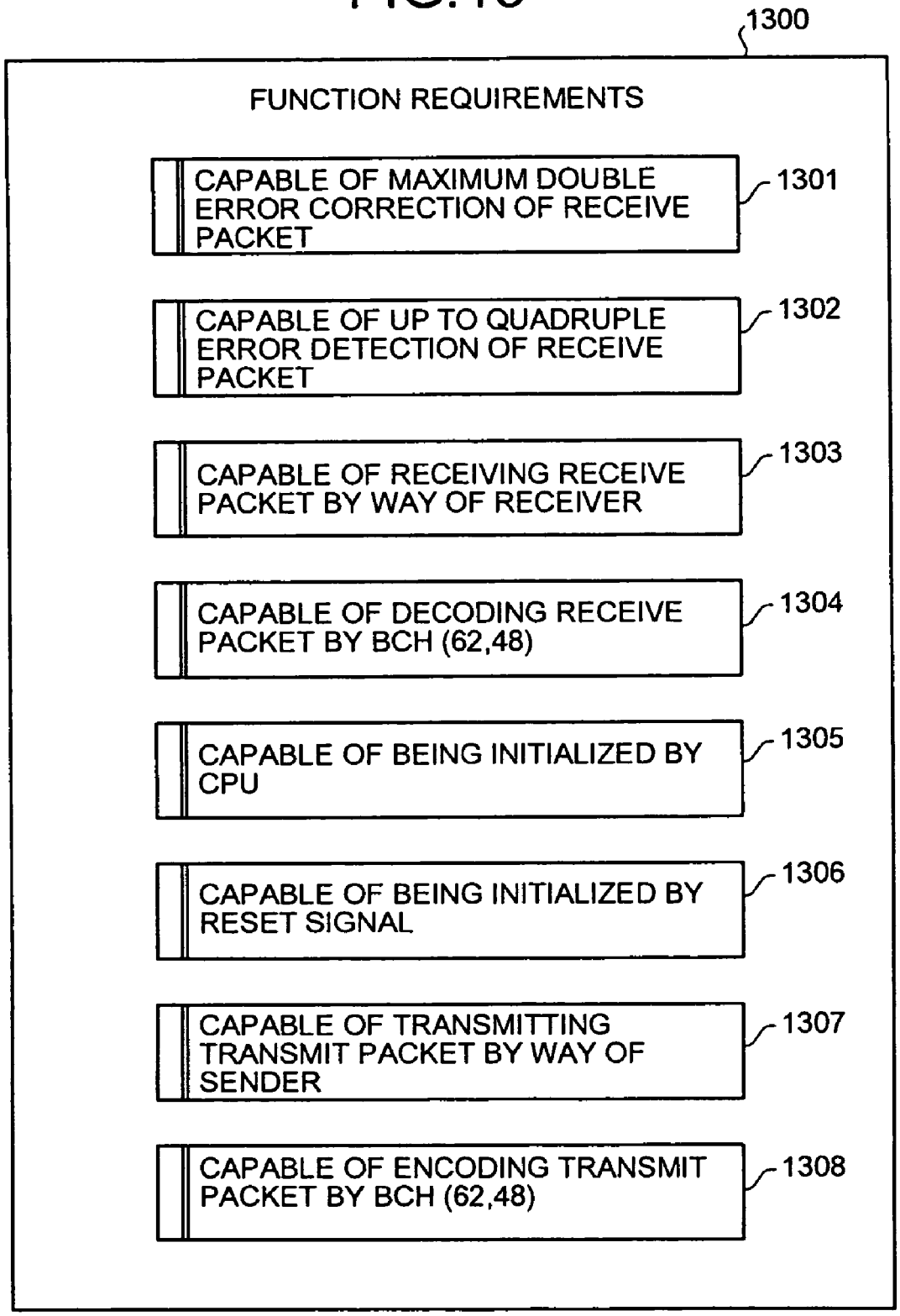
FIG. 13 is an explanatory diagram of a requirement item list of the system LSI as requirement definition.
Figure 14:
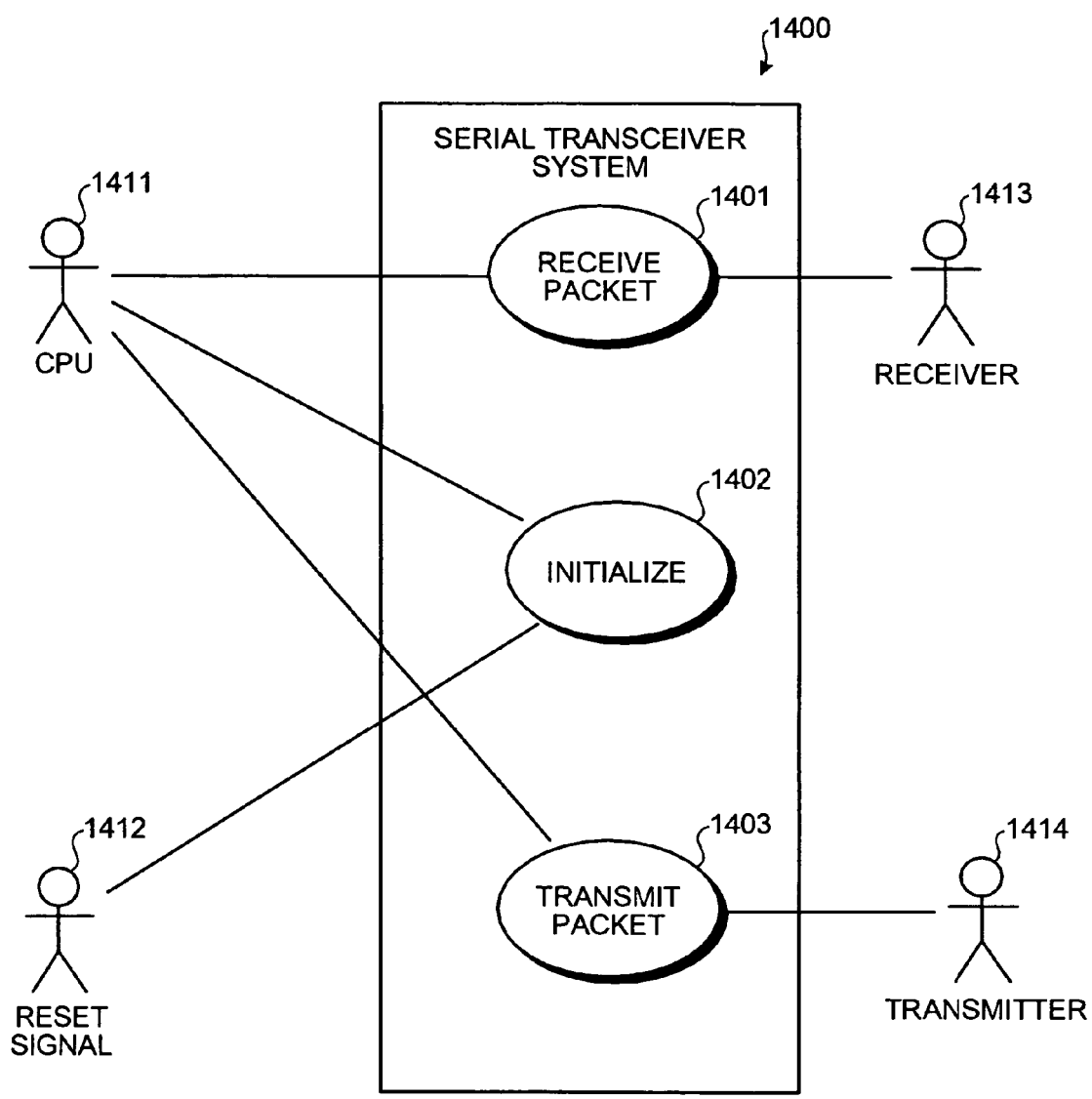
FIG. 14 is a use case diagram of the system LSI as requirement definition.

FIG. 13 is an explanatory diagram of a requirement item list of the system LSI 600 as the requirement definition and FIG. 14 is a use case diagram of the system LSI 600 as the requirement definition.

In the requirement item list 1300 shown in FIG. 13, the following functions are required for the system LSI 600: "capable of maximum double error correction of the receive packet" (item 1301), "capable of up to quadruple error detection of the receive packet" (item 1302), "capable of receiving the receive packet by way of the receiver" (item 1303), "capable of decoding the receive packet by BCH(62,48)" (item 1304), "capable of being initialized by CPU" (item 1305), "capable of being initialized by reset signal" (item 1306), "capable of transmitting the transmit packet by way of sender" (item 1307), and "capable of encoding the transmit packet by BCH(62,48)" (item 1308).

The use case diagram 1400 shown in FIG. 14 is a diagram obtained by diagramming the functions required by the requirement item list 1300 shown in FIG. 13 and is described according to the unified modeling language (UML). As shown in FIG. 14, the serial transceiver system 1400 shown in FIG. 6 is equipped with the functions represented by the use cases 1401 to 1403 of "receive packet", "initialize" and "transmit packet". In the use case diagram 1400, the CPU 1411, the reset signal 1412, the receiver 1413, and the sender 1414 are diagrammed as actors related to the serial transceiver system 601.

In the use case diagram 1400 shown in FIG. 14, the use case 1401 receives the packet from the actor 1413, and transmits the received packet to the actor 1411. The use case 1402 initializes upon instruction from the actor 1411 and the actor 1412. The use case 1403 receives the packet from the actor 1411 and transmits the received packet to the actor 1414.

Figure 15:
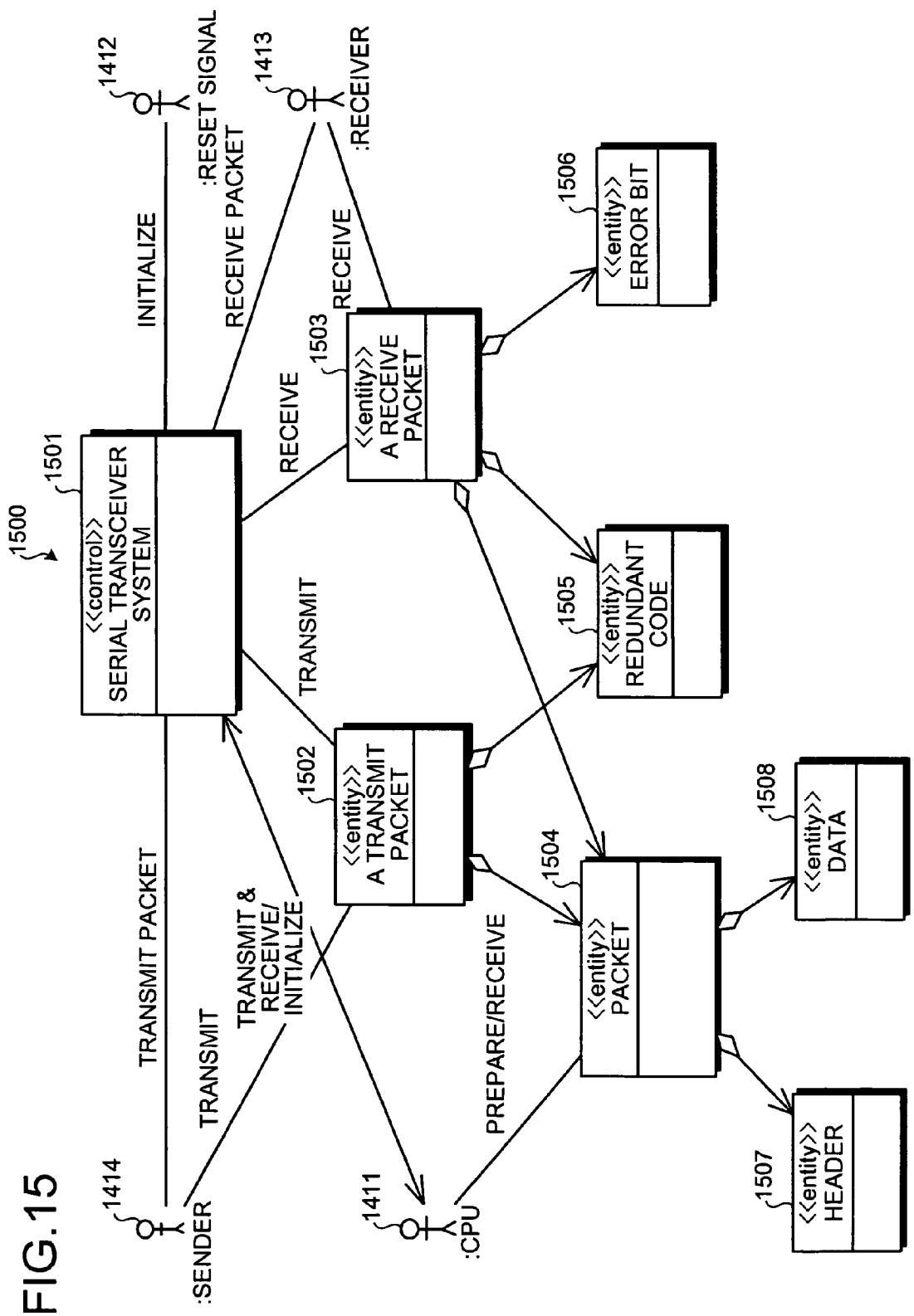
FIG. 15 is an analytical class diagram of the system LSI as a product of requirement definition.
Figure 16:
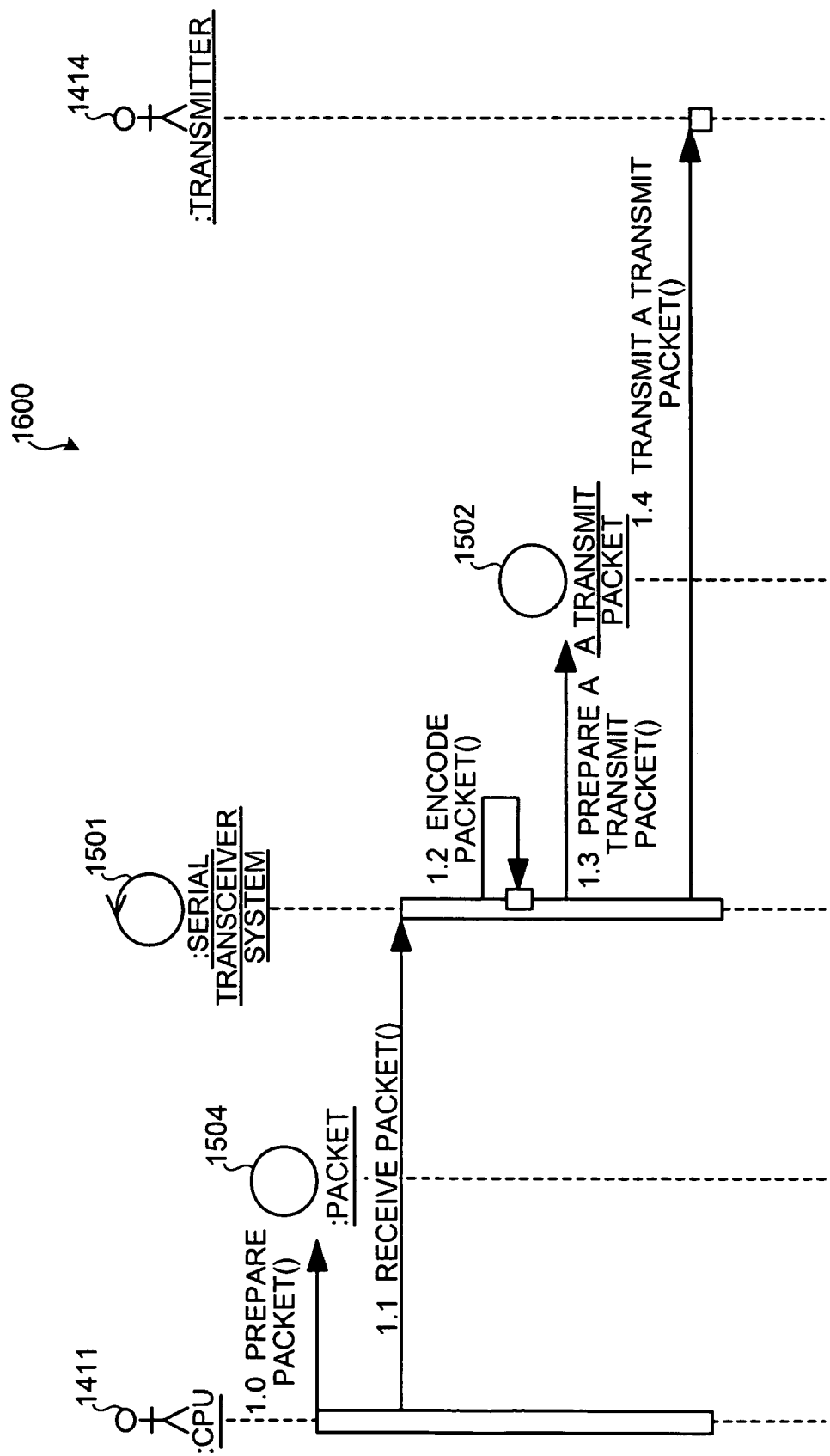
FIG. 16 is a sequence diagram of the system LSI as a product of requirement definition.

FIG. 15 is an analytical class diagram of the system LSI 600 as a product of the requirement definition, and FIG. 16 is a sequence diagram of the system LSI 600 as a product of the requirement definition.

The analytical class diagram 1500 shown in FIG. 15 carries description of a <<control>> class 1501 that controls data and procedures required for the serial transceiver system 601 and <<entity>> classes 1502 to 1508 in charge of processing peculiar to the serial transceiver system 601 inside the system. The <<control>> class 1501 represents the serial transceiver system 601. The <<entity>> classes 1502 to 1508 represent the transmit packet 612, the receive packet 611, packets 613 and 614, the redundant code 1201, the error bit, the header 1101, and the data 1102.

In the analytical class diagram 1500 shown in FIG. 15, the <<control>> class 1501 (serial transceiver system 601) transmits the packet from the actor 1414 (sender 603). The <<control>> class 1501 also performs transmission and reception/initialization in relation to the actor 1411 (CPU). The <<control>> class 1501 further performs the transmission of the <<entity>> class 1502 (transmit packet 612), the reception of the <<entity>> class 1503 (receive packet 611), and the initialization from the actor 1412 (reset signal). The <<control>> class 1501 also receives the packet from the actor 1413 (receiver 602) who has received the <<entity>> class 1503 (receive packet 611).

In the analytical class diagram shown in FIG. 15, the <<entity>> class 1502 (transmit packet 612) integrates the <<entity>> class 1504 (packets 613 and 614) and the <<entity>> class 1505 (redundant code 1201). The <entity>> class 1503 (receive packet 611) integrates the <<entity>> class 1505 (redundant code 1201) and the <<entity>> class 1506 (error bit). The <<entity>> class 1504 (packets 613 and 614) integrates the <<entity>> class 1507 (header 1101) and the <<entity>> class 1508 (data 1102). This shows that the actor 1411 (CPU 604) performs the preparation/reception of the <<entity>> class 1504 (packets 613 and 614).

The sequence diagram 1600 shown in FIG. 16 shows the motion in the case of transmitting the packet normally. The sequence diagram 1600 indicates that transmit processing is performed in the order of sequence number, namely, in the following order; sequence number 1.0 ("prepare packet( )")→sequence number 1.1 ("receive packet( )")→sequence number 1.2 ("encode packet( )")→sequence number 1.3 ("prepare transmit packet( )")→sequence number 1.4 ("transmit the transmit packet( )")

Figure 17:
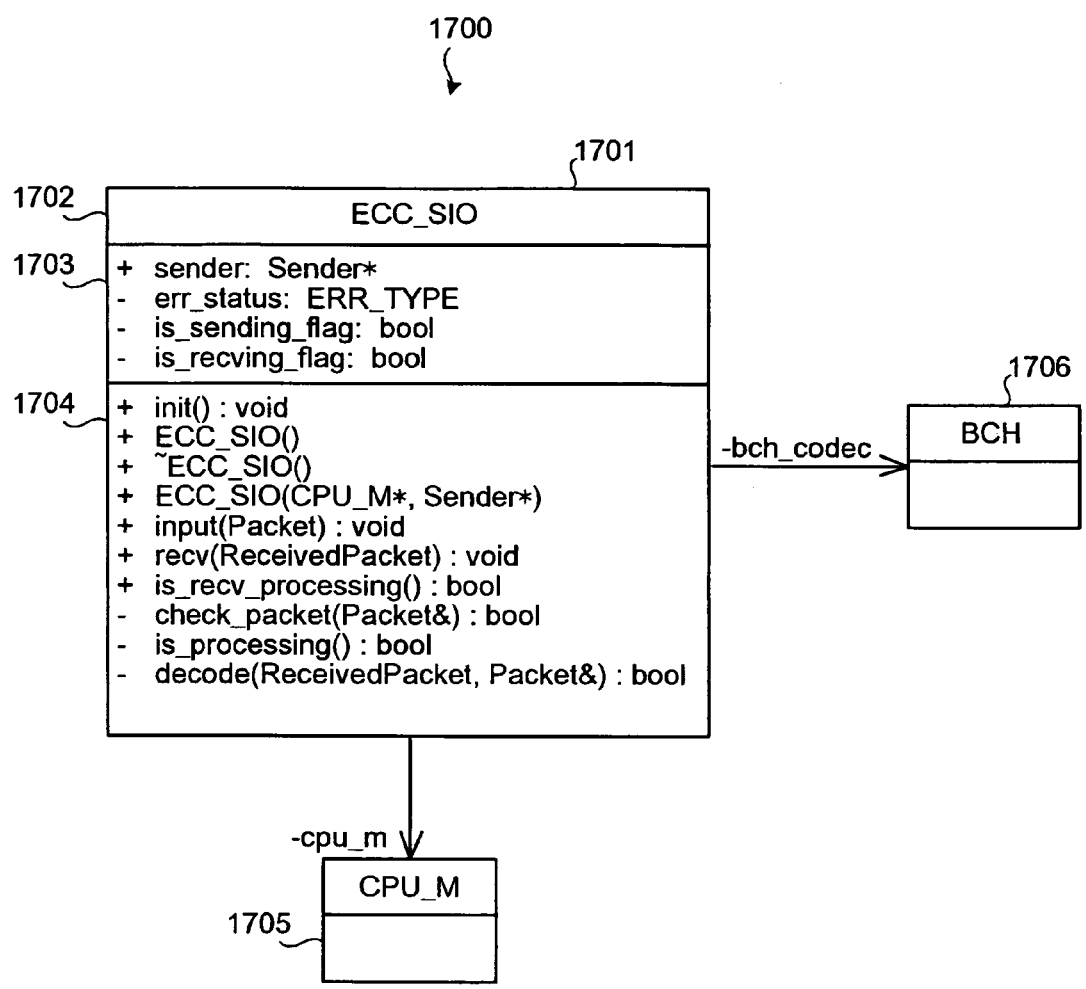
FIG. 17 is a design class diagram of the system LSI including a serial transceiver system.

FIG. 17 is a design class diagram of the system LSI including the serial transceiver system. In the design class diagram 1700, a class 1701 includes a class name 1702 for which a designation of the serial transceiver system, "ECC_SIO", is described, an attribute 1703 (member variable) indicative of static property of the class 1701, and an operation 1704 (member function) indicative of dynamic property of the class 1701. The operation 1704 is working on the class 1705 indicative of the CPU and the class 1706 indicative of encoding. Based on the design class diagram 1700 shown in FIG. 17, implementation codes of the concept model 101 are generated. One description example of the implementation codes of the concept model 101 is shown in FIG. 17. FIG. 18 is an explanatory diagram of the implementation codes 1800 of the concept model 101. The implementation codes 1800 is the codes modeled in C++ language.

FIG. 19 is an explanatory diagram of the verification items of the system LSI including the serial transceiver system.

In FIG. 19, as to the use case to be verified, attention is directed to the use case 1401 shown in FIG. 14. In the verification items 1900, "basic path" under the item name of "Sequence" indicates a normal packet transmit processing, namely, the processing of sequence number 1.0 to 1.1 shown in FIG. 16.

Figures 20, 21:
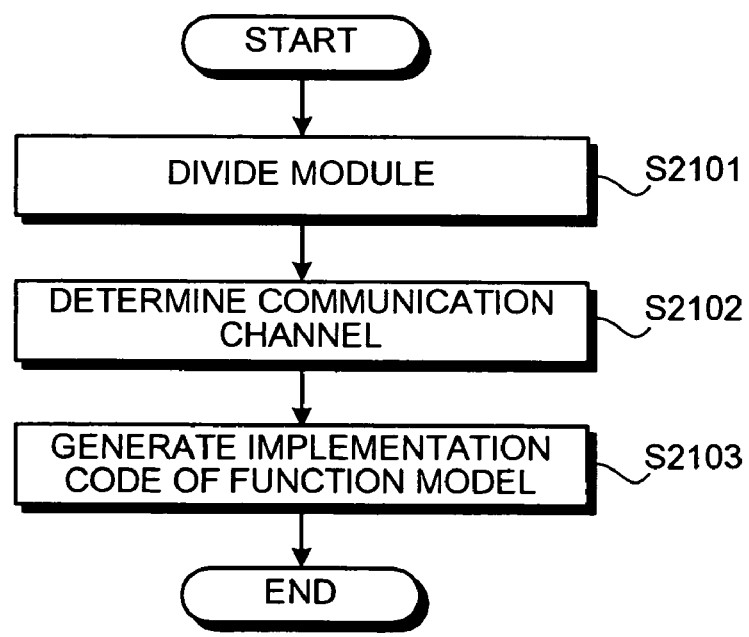
FIG. 20 is an explanatory diagram of a verification scenario of the system LSI including the serial transceiver system.
FIG. 21 is a flowchart of an implementation code generation process of a function model of the system LSI including the serial transceiver system.

FIG. 20 is an explanatory diagram of the verification scenario of the system LSI including the serial transceiver system. A verification scenario 2000 is generated using the sequence diagram 1500 shown in FIG. 15 and the verification items 1900 shown in FIG. 19.

When obtained results of the verification are that an error is constantly notified to the CPU, an error in the specification is detected that the serial transceiver system is set to an error state at the time of a packet reception error, but the system remains in the error state even if the system receives the next packet normally. As a result, a corrective action is taken by so arranging that after the CPU has received the error notice, the error state of the serial transceiver system is cleared. In this manner, the error in the specification is eliminated.

FIG. 21 is a flowchart of an implementation code generation processing procedure for the function model of the system LSI including the serial transceiver system. The processing procedure shown in FIG. 21 is a detailed processing procedure of the processing step shown at step S503 of FIG. 5.

Figure 22:
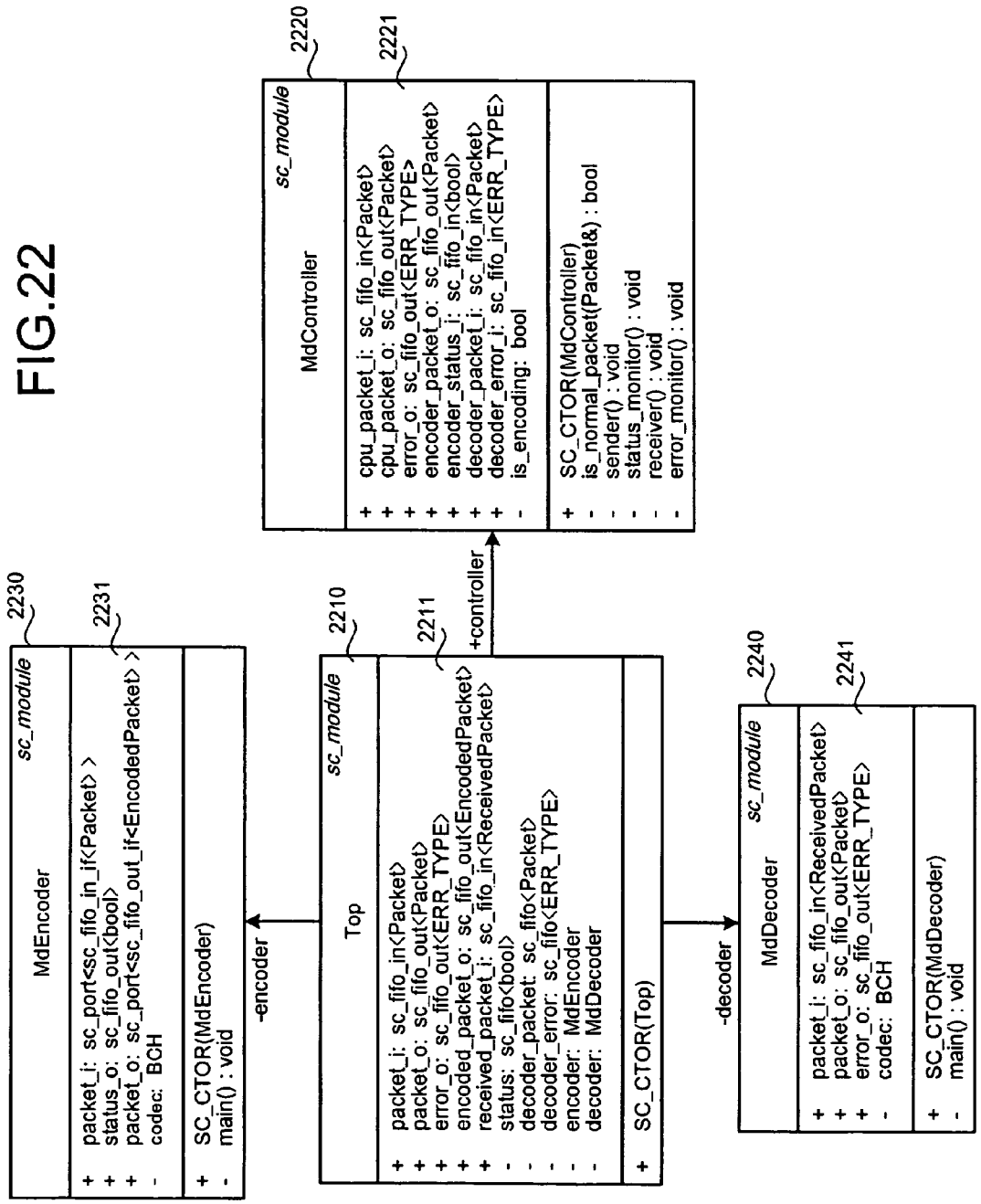
FIG. 22 is an explanatory diagram of divided design class diagrams obtained by dividing the design class diagram shown in FIG. 17.

The design class diagram (see FIG. 17) of the concept model generated at step S502 is divided into concurrent and parallel modules (step S2101). FIG. 22 is an explanatory diagram of divided design class diagrams obtained by dividing the design class diagram shown in FIG. 17.

The design class diagram shown in FIG. 17 is divided into a divided class diagram 2210 regarding a top module, a divided class diagram 2220 regarding a controller module, a divided class diagram 2230 regarding an encoder module, and a divided class diagram 2240 regarding a decoder module shown in FIG. 22.

Figure 23:
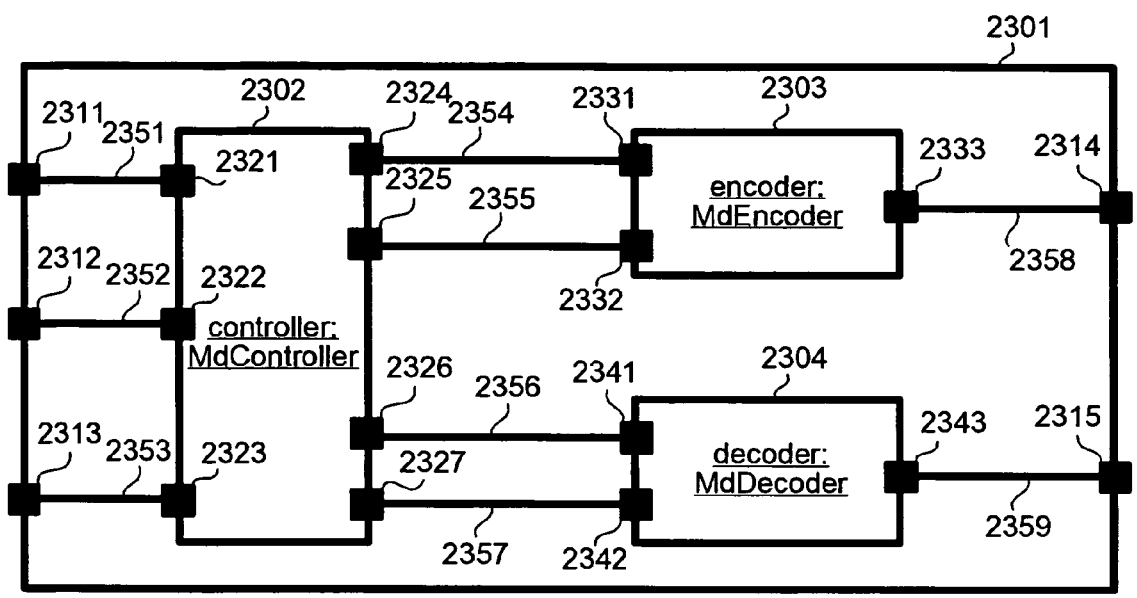
FIG. 23 is an explanatory diagram of communication channels connecting modules represented by the divided design class diagrams.

Then, communication channels are determined that interconnects the modules represented by the divided design class diagrams 2210 to 2240 (step S2102). FIG. 23 is an explanatory diagram of the communication channels interconnecting the modules represented by the divided design class diagrams.

The top module 2301 has ports 2311 to 2315. The ports 2311 to 2315 are described in the attribute 2211 of the divided design class diagram 2210 regarding the top module. Specifically, the port 2311 is indicated by "packet_i: sc_fifo_in<Packet>" and is an input port for input of <Packet> from the CPU. The port 2312 is indicated by "packet_o:sc_fifo_out<Packet>" and is an output port for output of <Packet> to the CPU. The port 2313 is indicated by "error_o: sc_fifo_out<ERR.TYPE>" and is an output port for output of error type information <ERR.TYPE> to the CPU.

The port 2314 is indicated by "encoded_packet_o: sc_fifo_out<EncodedPacket>" and is an output port for output of an encoded packet <EncodedPacket>. The port 2315 is indicated by "received_packet_i:sc_fifo_in<ReceivedPacket>" and is an input port for input of a packet received from outside <ReceivedPacket>.

The controller module 2302 has ports 2321 to 2327. The ports 2321 to 2327 are described in the attribute 2221 of the divided design class diagram 2220 regarding the controller module 2302. Specifically, the port 2321 is indicated by "cpu_packet_i:sc_fifo_in<Packet>" and is an input port for input of <Packet> from the CPU. The port 2322 is indicated by "cpu_packet_o:sc_fifo_out<Packet>" and is an output port for output of <Packet> to the CPU. The port 2323 is indicated by "error_o:sc_fifo_out<ERR.TYPE>" and is an output port for output of error type information <ERR.TYPE> to the CPU.

The port 2324 is indicated by "encoder_packet_o: sc_fifo_out<Packet>" and is an output port for output of <Packet> to the encoder module. The port 2325 is indicated by "encoder_status_i:sc_fifo_in<bool>" and is an input port for input of status information <bool> of the encoder module 2303. The port 2326 is indicated by "decoder_packet_i: sc_fifo_in<Packet>" and is an input port for input of <Packet> from the decoder module. The port 2327 is indicated by "decoder_error_i:sc_fifo_in<ERR.TYPE>" and is an input port for input of error type information <ERR.TYPE> from the decoder module.

The encoder module 2303 has ports 2331 to 2333. The ports 2331 to 2333 are described in the attribute 2231 of the divided design class diagram 2230 regarding the encoder module 2303. Specifically, the port 2331 is indicated by "packet_i:sc_fifo_in_if<Packet>" and is an input port for input of <Packet>. The port 2332 is indicated by "status_o: sc_fifo_out<bool>" and is an output port for output of status information <bool> of the encoder module 2303. The port 2333 is indicated by "packet_o:sc_fifo_out_if<Encoded Packet>" and is an output port for output of a packet encoded by the encoder module 2303 <EncodedPacket>.

The decoder module 2304 has ports 2341 to 2343. The ports 2341 to 2343 are described in the attribute 2241 of the divided design class diagram 2240 regarding the decoder module 2304. Specifically, the port 2341 is indicated by "packet_o:sc_fifo_out<Packet>" and is an oputput port for output of <Packet>. The port 2342 is indicated by "error_o: sc_fifo_out<ERR.TYPE>" and is an output port for output of error type information <ERR.TYPE>. The port 2343 is indicated by "packet_i:sc_fifo_in<ReceivedPacket>" and is an input port for input of a received packet <ReceivedPacket>.

In this manner, the communication channels 2351 to 2359 are determined by interconnecting the ports 2311 to 2315, the ports 2321 to 2327, the ports 2331 to 2333, and the ports 2341 to 2343, using the attributes of the divided design class diagrams 2210 to 2240. Specifically, the communication channels 2351 to 2359 are channels of communication by a FIFO method.

Figure 24:
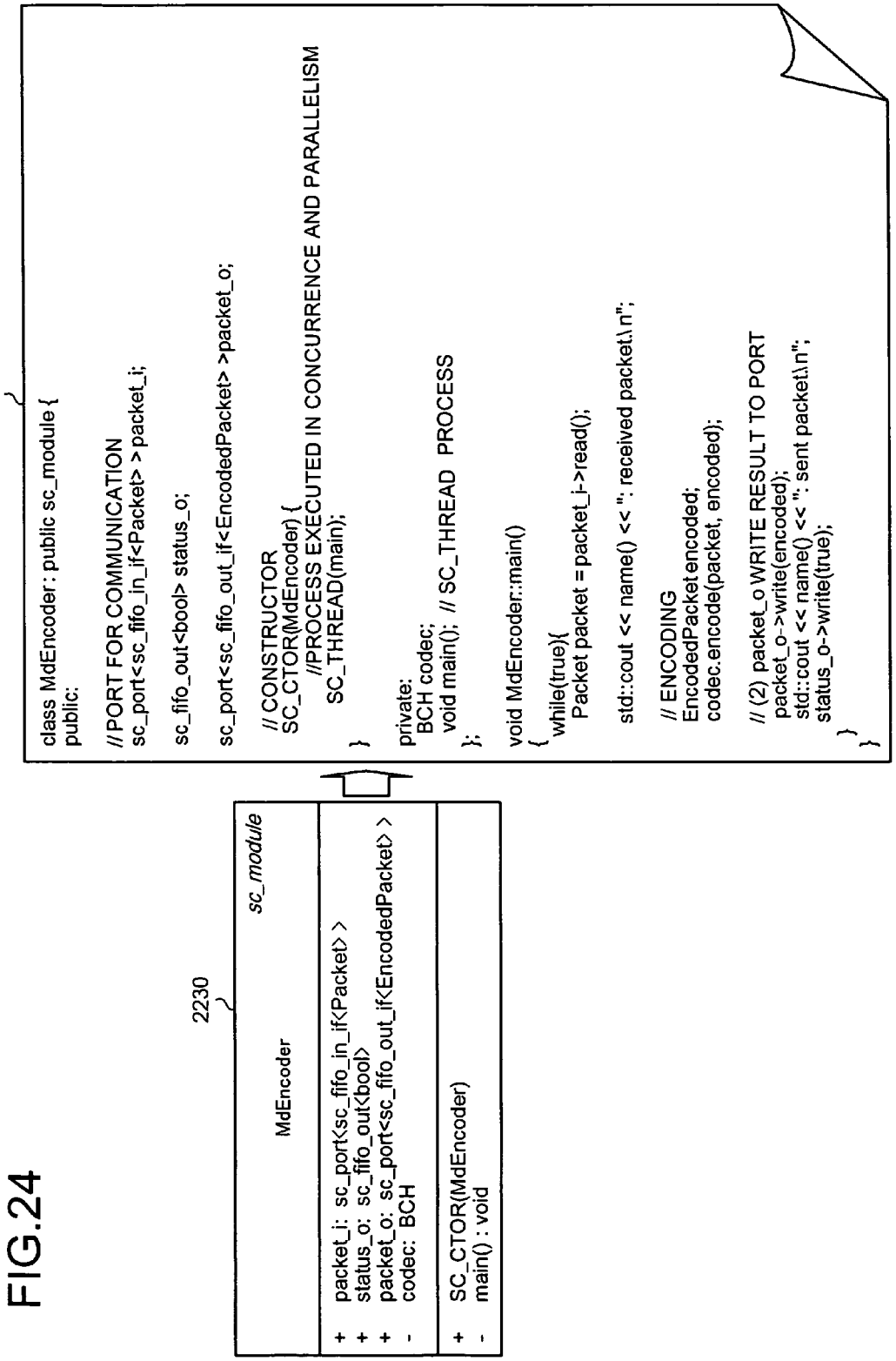
FIG. 24 is an explanatory diagram of a generated example of implementation code of a function model of the system LSI including the serial transceiver system.

In FIG. 21, after the communication channels are determined, the implementation codes of the function model are generated (step S2103). FIG. 24 is an explanatory diagram of a generated example of the implementation codes of the function model of the system LSI including the serial transceiver system.

FIG. 24 shows the implementation codes 2400 of the encoder module 2303 generated from the divided design class diagram 2230 regarding the encoder module 2303. Though not shown, the implementation codes are generated also with respect to the divided design class diagram 2210 regarding the top module, the divided design class diagram 2220 regarding the controller module 2302, and the divided design class diagram 2240 regarding the decoder module 2304. At step S504 of FIG. 5, simulation of the implementation codes of each of divided design class diagrams 2210 to 2240 is performed.

Thereafter, at step S505 of FIG. 5, determination is made as to whether results of the simulation mentioned above and results of the simulation of the implementation codes of the concept model correspond, and if these results match (step S505: YES), then it is verified that the module division shown in FIG. 22 is proper and that the concurrence and parallelism of the module division are accurate.

On the other hand, if these results do not match (step S505: NO), then, on the ground that the module division shown in FIG. 22 is not proper and that the concurrence and parallelism of the module division are not accurate, the implementation codes generated at step S2103 of FIG. 21 are modified as shown at step S506 of FIG. 5. The above verification of the function model can confirm that same results as obtained by the verification of the concept model are obtained.

Figure 25:
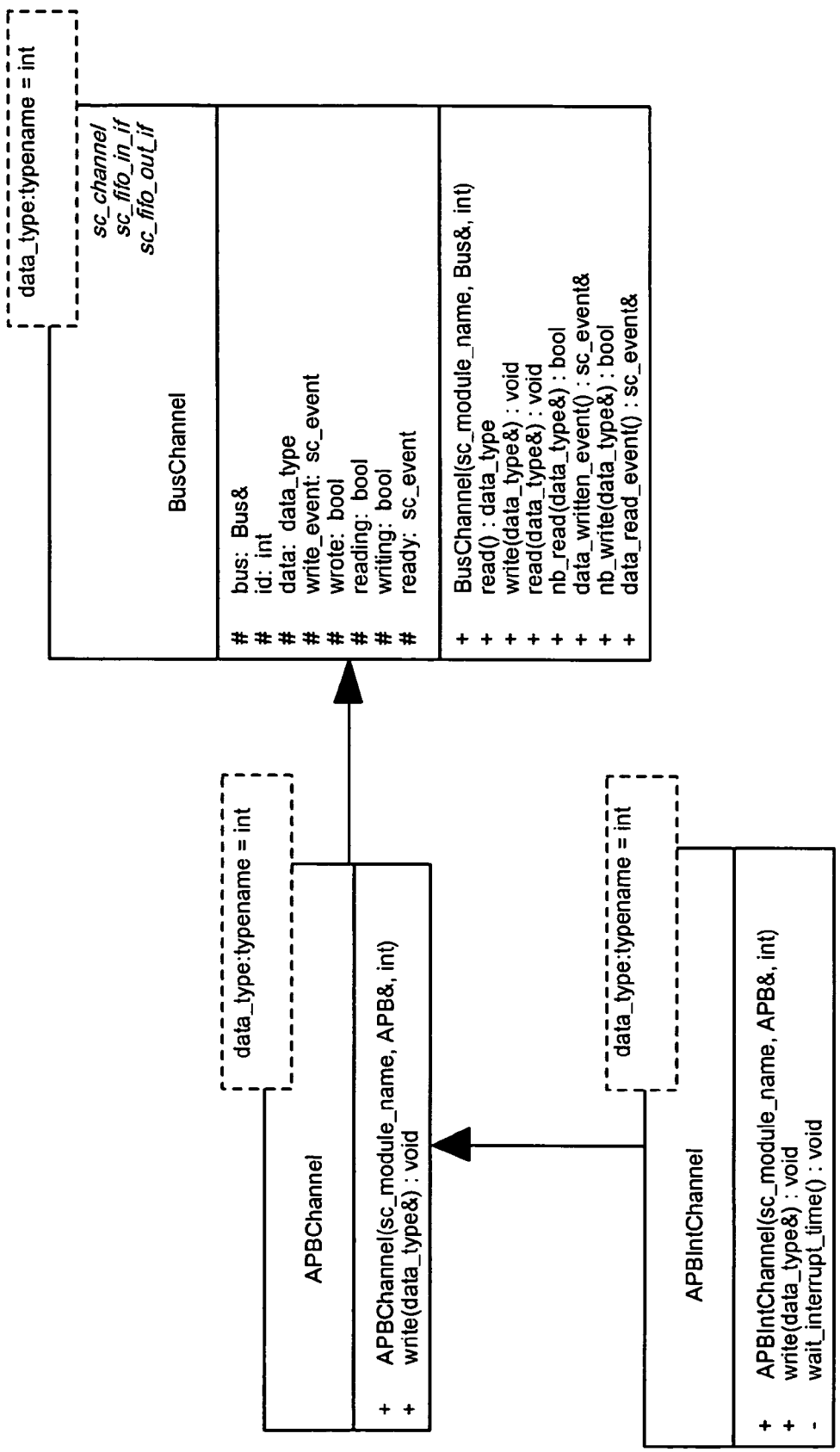
FIG. 25 is an explanatory diagram of an example of a class diagram of an architecture model of the system LSI including the serial transceiver system.

FIG. 25 is an explanatory diagram of one example of a class diagram of the architecture model of the system LSI including the serial transceiver system. Architecture model is a model of physical hardware parts of existing design such as a bus and IP, and here a bus model is shown.

Architecture model is basically prepared in advance and is provided as a verified library and a verified bus model is described in FIG. 25. As seen, the architecture model uses physical hardware parts of existing design and therefore, verification is not necessary.

Figure 26:
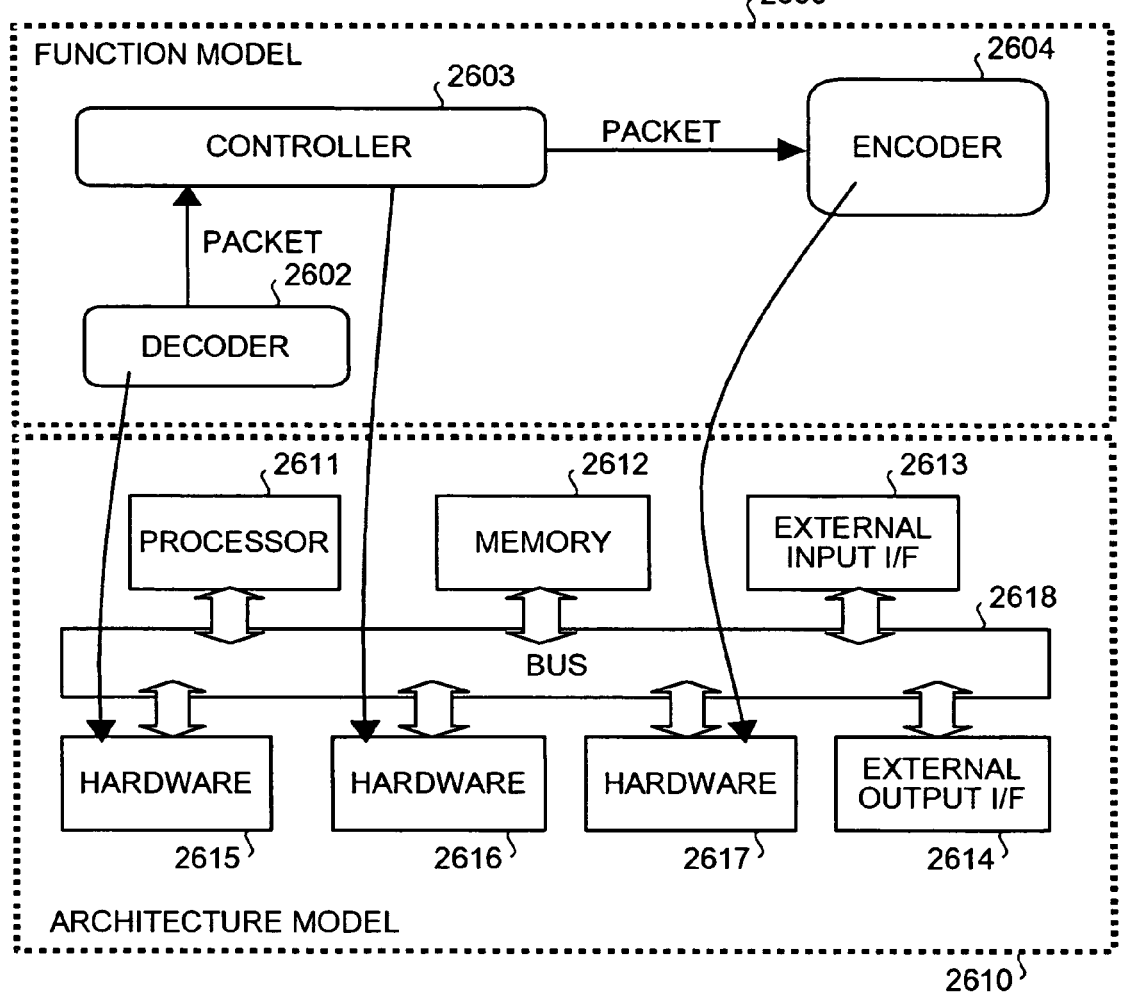
FIG. 26 is an explanatory diagram of mapping of the function model and the architecture model.

As described above, the motion model is conceptually a product of mapping the function model to the architecture model. FIG. 26 is an explanatory diagram of the mapping of the function model and the architecture model.

In FIG. 26, in the function model, as shown in FIG. 23, the packet received from outside is input to and decoded by the decoder 2602 and provided to the controller 2603. The controller 2603 outputs the decoded packet to the encoder 2604 and the encoder 2604 encodes the packet.

The architecture model 2610 is a model of physical hardware parts of existing design such as bus and IP, and in this case includes a processor 2611, a memory 2612, an external input I/F 2613, an external output I/F 2614, hardware 2615, hardware 2616, hardware 2617 and a bus 2618 interconnecting them.

The function model 2600 is mapped to the architecture model 2610. Specifically, the decoder 2602 is mapped to hardware 2615, the controller 2603 is mapped to hardware 2616, and the encoder 2604 is mapped to the hardware 2617. What has been described using FIGS. 25 and 26 corresponds to the processing step shown at step S507 of FIG. 5.

Figure 27:
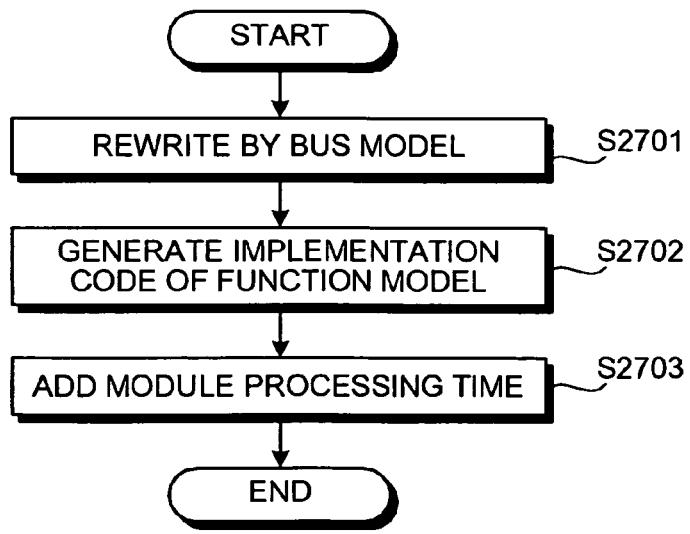
FIG. 27 is a flowchart of an implementation code generation process of a motion model of the system LSI including the serial transceiver system.

FIG. 27 is a flowchart of the implementation code generation process of the motion model of the system LSI including the serial transceiver system. FIG. 27 shows a detailed processing of the processing shown at step S507 of FIG. 5.

To realize the mapping shown in FIG. 26, descriptions within attributes 2211 to 2241 of divided design class diagrams 2210 to 2240 shown in FIG. 22 are replaced by the description of the bus model shown in FIG. 25 (step S2701). FIG. 28 is an explanatory diagram of the divided design class diagram 2210 in which the description within the attribute 2211 has been replaced by the description of the bus model. In FIG. 28, at underlined portion of description, communication channel has been changed from the FIFO-type description to the bus model description.

From the divided design class diagrams 2210 to 2240 rewritten to the bus model description, the implementation codes of the function model are generated (step S2702). Then, an estimated processing time of each module is added to thus generate implementation codes of the function model (step S2703).

FIG. 29 is an explanatory diagram of an example of addition of the estimated processing time of each module to the implementation codes. For example, if the estimated processing time of the decoder 2602 and the encoder 2604 is 600 [ns] as shown in a table 2900 of FIG. 29, the description 2901 of the processing time shown in the table 2900 is added to the implementation codes of the function model (for example, the implementation codes 2400 shown in FIG. 24). As a result, the implementation codes 2902 of the motion model are generated. At step S508 of FIG. 5, simulation of the implementation codes 2902 of the motion model is performed.

At step S509 of FIG. 5, determination is made as to match of results of this simulation and results of simulation of the implementation codes of the concept model and the case of match (step S509: YES) indicates that the results of simulation of the implementation codes 2902 of the motion model satisfy all of the requirement items 1301 to 1308 of the requirement item list 1300 shown in FIG. 13 and that the mapping of the function model and the architecture model is proper.

On the other hand, the case of mismatch (step S509: NO) indicates that the results of simulation of the implementation codes of the motion model satisfy none of the requirement items 1301 to 1308 of the requirement item list 1300 shown in FIG. 13 and that the mapping of the function model and the architecture model is not proper. In this case, at step S510 of FIG. 5, the implementation codes 2902 of the motion model are modified. In this manner, verification can be made as to whether the motion (performance) required by the customer is satisfied.

FIG. 30 is a flowchart of the implementation code generation process of the ICA model of the system LSI including the serial transceiver system. FIG. 30 shows a detailed processing of the processing shown at step S511 of FIG. 5.

As described above, the ICA model is a model built with the cycle accuracy with respect to interfaces outside modules and with the motion level inside modules. By the high-level synthesis of this ICA model, the RTL description is generated. In the ICA model, accuracy of interface can be verified.

Figure 31:
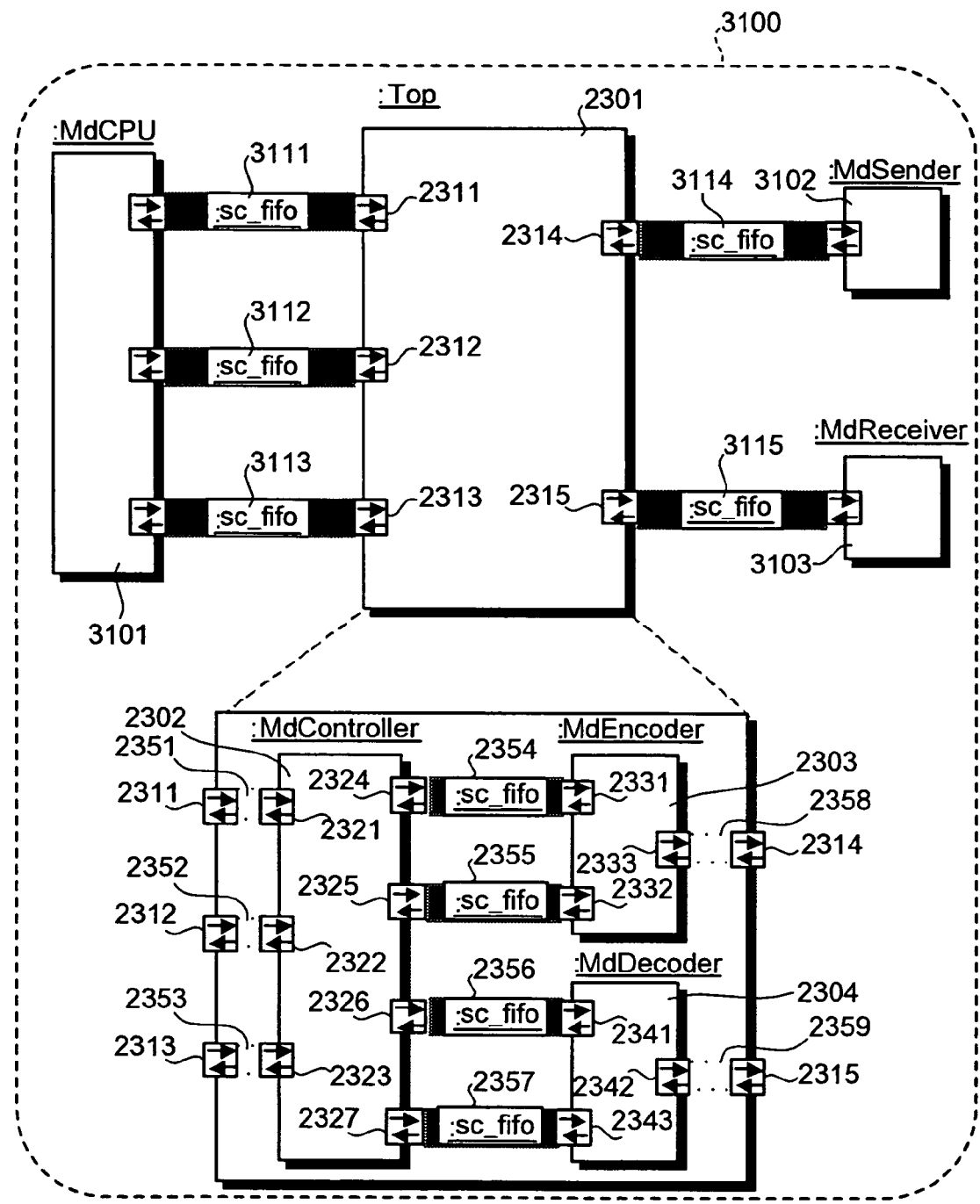
FIG. 31 is a structural view of the function model with communication channels determined of the system LSI including the serial transceiver system.

A communication channel communicating between modules of different degree of abstraction is detected from a structural view of the function model whose communication channel has been determined (step S3001). FIG. 31 is a structural view of the function model with a communication channel determined of the system LSI including the serial transceiver system.

In FIG. 31, as a result of division of the design class diagram shown in FIG. 17 into concurrent and parallel modules (see step S2101 of FIG. 21), the serial transceiver system is a system in which the top module 2301, the CPU module 3101, the sender module 3102, and the receiver module 3103 are connected by the FIFO type communication channels 3111 to 3115. The inside of the top module 2301 is of the same structure as shown in the structural view of FIG. 23. Communication channels communicating between modules of different degree of abstraction are detected from the connecting relationship of these modules.

Figure 32:
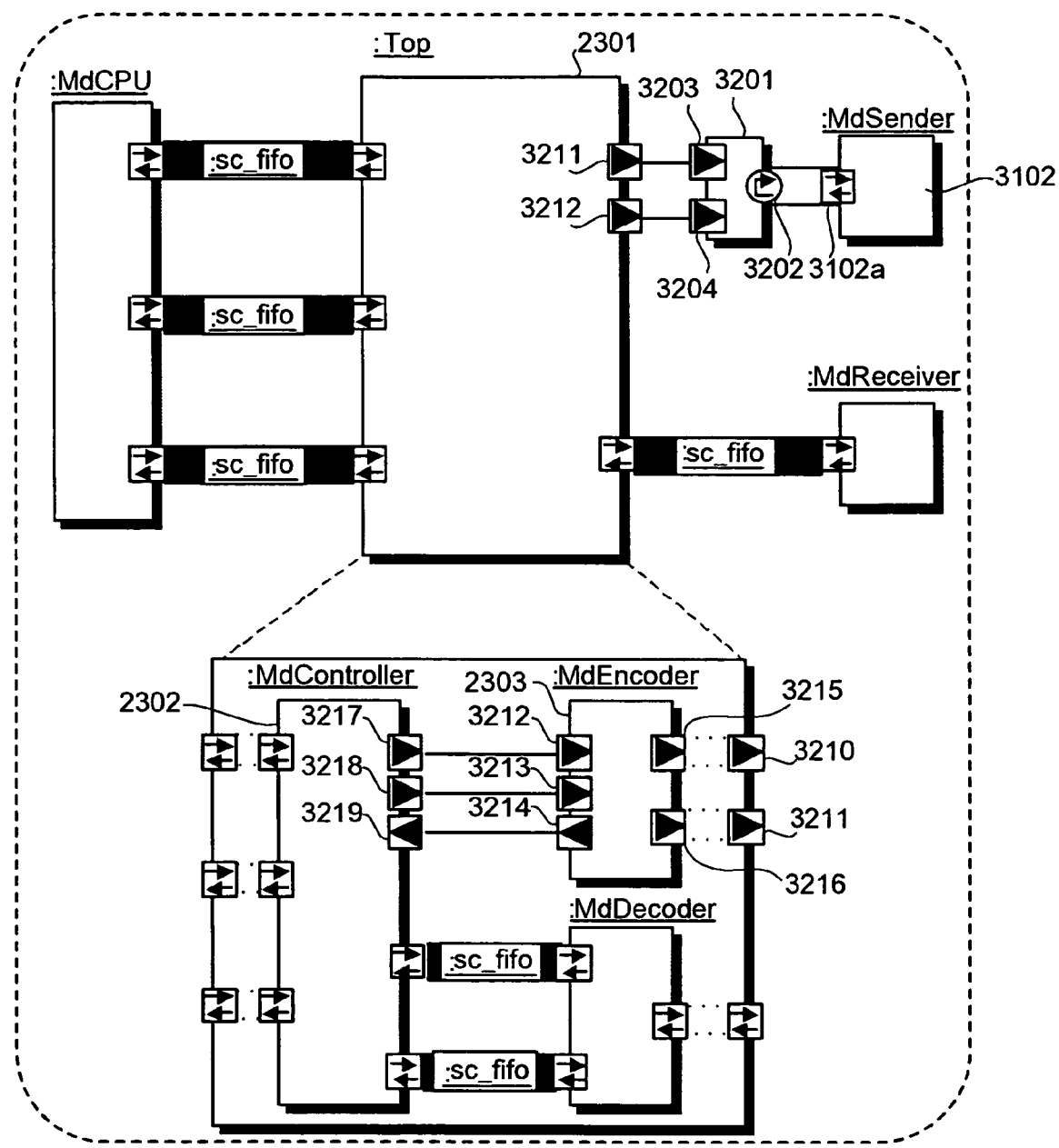
FIG. 32 is a structural view of an interface wrapper inserted into the communication channels within the structural diagram shown in FIG. 31.

Next, detected communication channels are replaced by an interface wrapper (step S3002). FIG. 32 is a structural view of the interface wrapper inserted to the communication channels in the structural view shown in FIG. 31. Since in FIG. 31, the degree of abstraction of the encoder module 2303 and the degree of abstraction of the sender module 3102 are different, the communication channel between these modules 2303 and 3102 is inserted to the interface wrapper 3201, and the degree of abstraction of the top module 2301 is converted.

The interface wrapper 3201 is equipped with a transaction level interface 3202 connected to a transaction level port 3102a of the sender module 3102 and two signal level ports 3203 and 3204 connected to the top module 2301. Therefore, a transaction level port 2314 is replaced by signal level ports 3210 and 3211.

Inside the top module 2301, transaction level ports 2331 to 2333 of the encoder module 2303 are placed by signal level ports 3212 to 3216. By this port conversion, transaction level ports 2324 and 2325 of the controller module 2302 are also converted to signal level ports 3217 to 3219.

Figure 33:
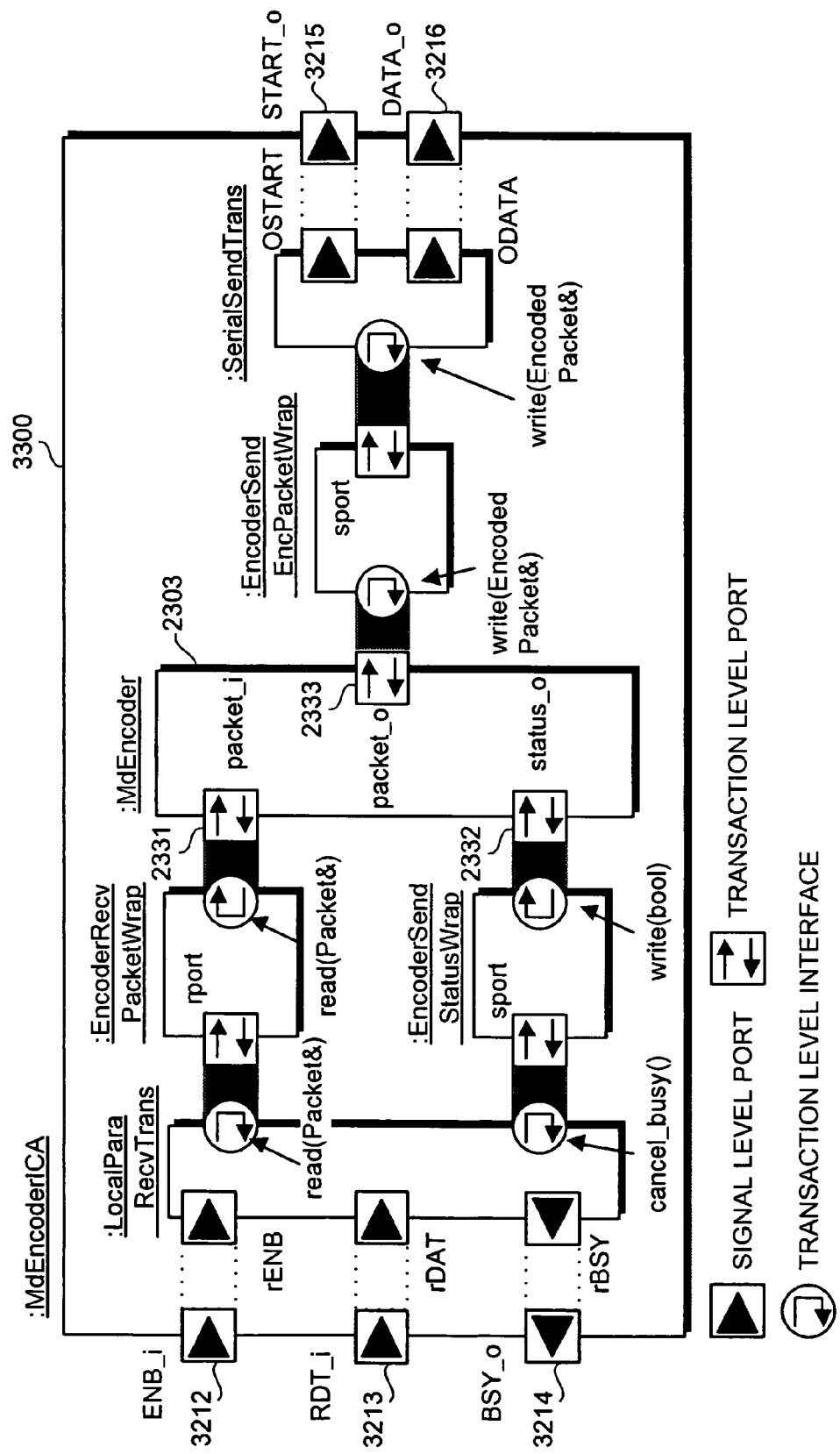
FIG. 33 is a schematic diagram for illustrating an internal structure of an encoder module of an ICA model.

Since the number of ports of the encoder module 2303 is changed as seen above, the encoder module 2303 shown in FIG. 31 is converted to the encoder module of the ICA model (step S3003) and the degree of abstraction of the encoder module 2303 itself is converted. FIG. 33 is an explanatory diagram of an example of internal structure of the encoder module of the ICA model.

As shown in FIG. 33, the encoder module 3300 of the ICA model is equipped with the encoder module 2303 and ports 2331 to 2333 shown in FIG. 31. To enable the communication between ports 2331 and 2332 and ports 3212 to 3214, various wrappers and ports are inserted. Likewise, to enable the communication between a port 2332 and ports 3215 and 3216, various wrappers and ports are inserted.

Thereafter, implementation codes of the encoder module 3300 of the ICA model are generated (step S3004). FIG. 34 is an explanatory diagram of an example of the implementation codes of the encoder module 3300 of the ICA model. Simulation of the implementation codes 3400 of ICA model is performed, at step S512 of FIG. 5.

At step S513 of FIG. 5, determination is made as to match of results of simulation of the implementation codes 3400 of the ICA model and results of simulation of the implementation codes of the concept model and the case of match (step S513: YES) indicates that the results of simulation of the implementation codes 3400 of the ICA model satisfy all of the requirement items 1301 to 1308 of the requirement item list 1300 shown in FIG. 13 and that the insertion of the interface wrappers is proper.

On the other hand, the case of mismatch (step S513: NO) indicates that the results of simulation of the implementation codes 3400 of the ICA model satisfy none of the requirement items 1301 to 1308 of the requirement item list 1300 shown in FIG. 13 and that the insertion of the interface wrappers is not proper.

In this case, at step S514 of FIG. 5, the implementation codes 3400 of the ICA model are modified. In this manner, the accuracy of the interface can be verified.

Figure 35:
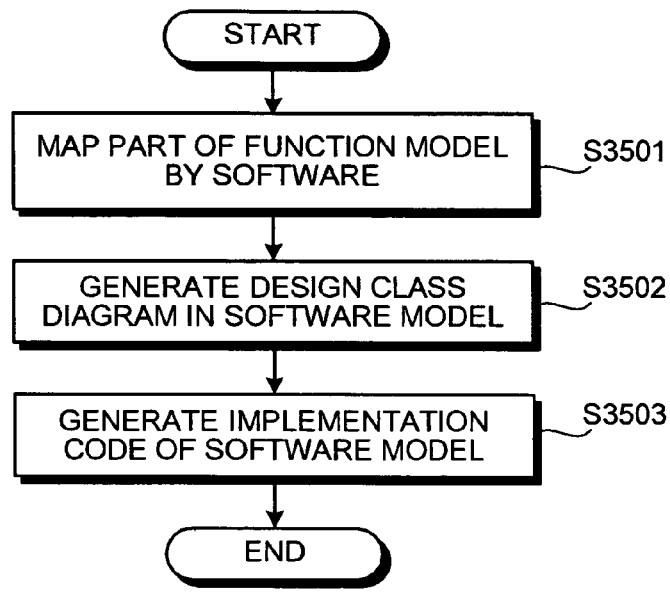
FIG. 35 is a flowchart of an implementation code generation process of a software model of the system LSI including the serial transceiver system.

FIG. 35 is a flowchart of the implementation code generation process of the software model of the system LSI including the serial transceiver system. FIG. 35 shows a detailed processing of the processing shown at step S516 of FIG. 5.

As described above, the software model is a model that performs task division of the software making up the system LSI including the serial transceiver system and is executed on a virtual OS. In FIG. 35, a part of function model is mapped by software to the architecture model (step S3501).

Figure 36:
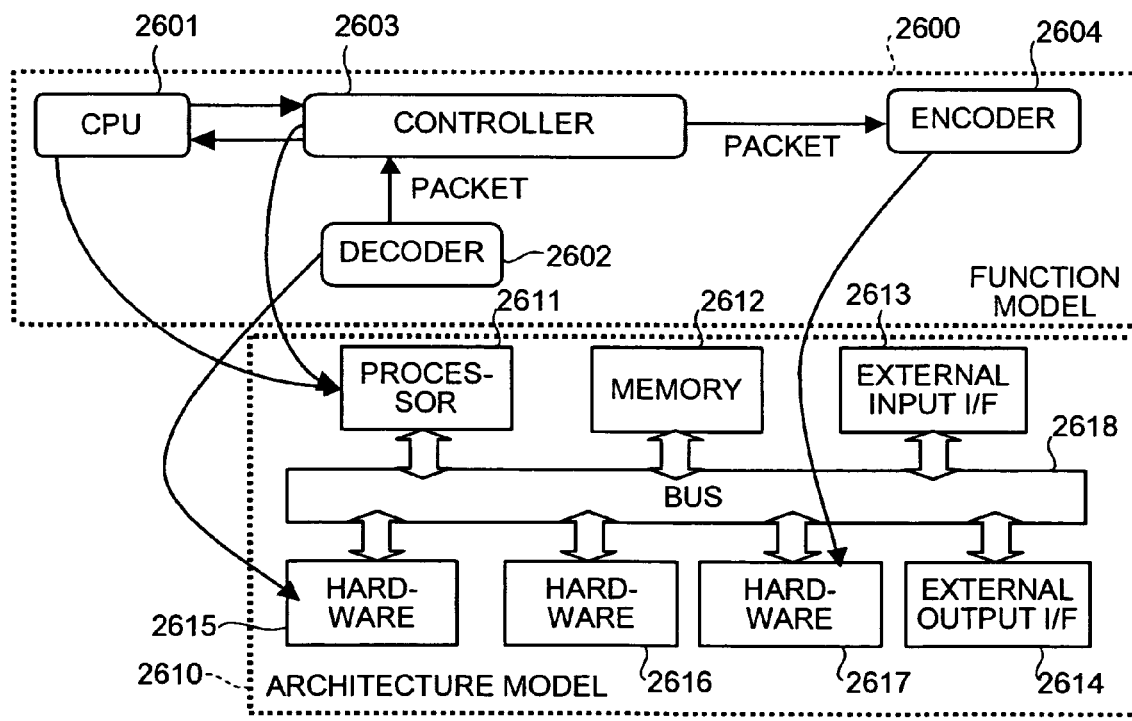
FIG. 36 is an explanatory diagram of an example of mapping by software of a part of the function model to the architecture model.

FIG. 36 is an explanatory diagram of an example of mapping by software of a part of the function model to the architecture model. Specifically, as shown in FIG. 26, the decoder 2602 is mapped to the hardware 2615 and the encoder 2604 is mapped to the hardware 2617. On the other hand, the CPU 2601 and the controller 2603 are mapped to the processor 2611.

Figure 37:
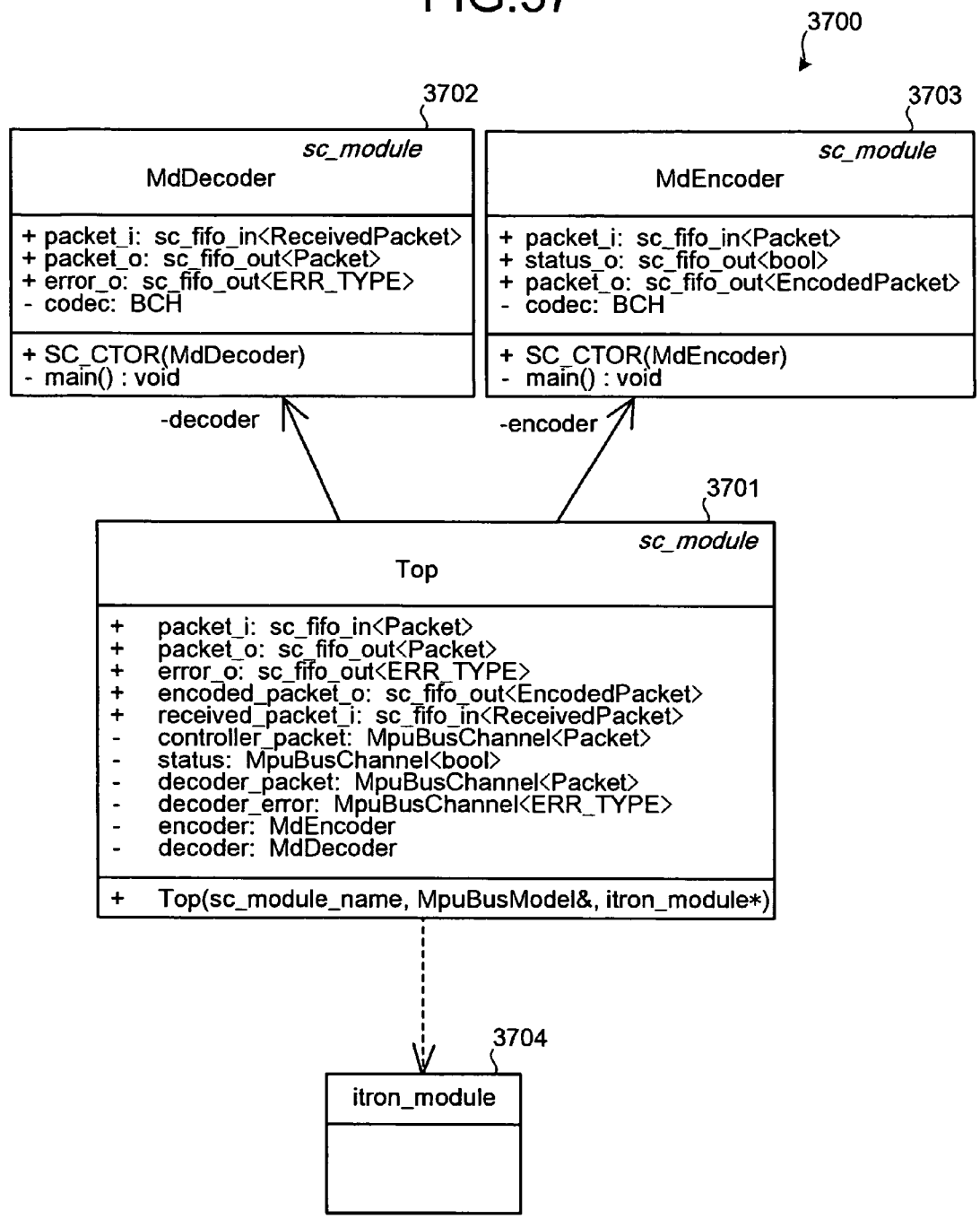
FIG. 37 is an explanatory diagram of a design class diagram in the software model.
Figure 38:
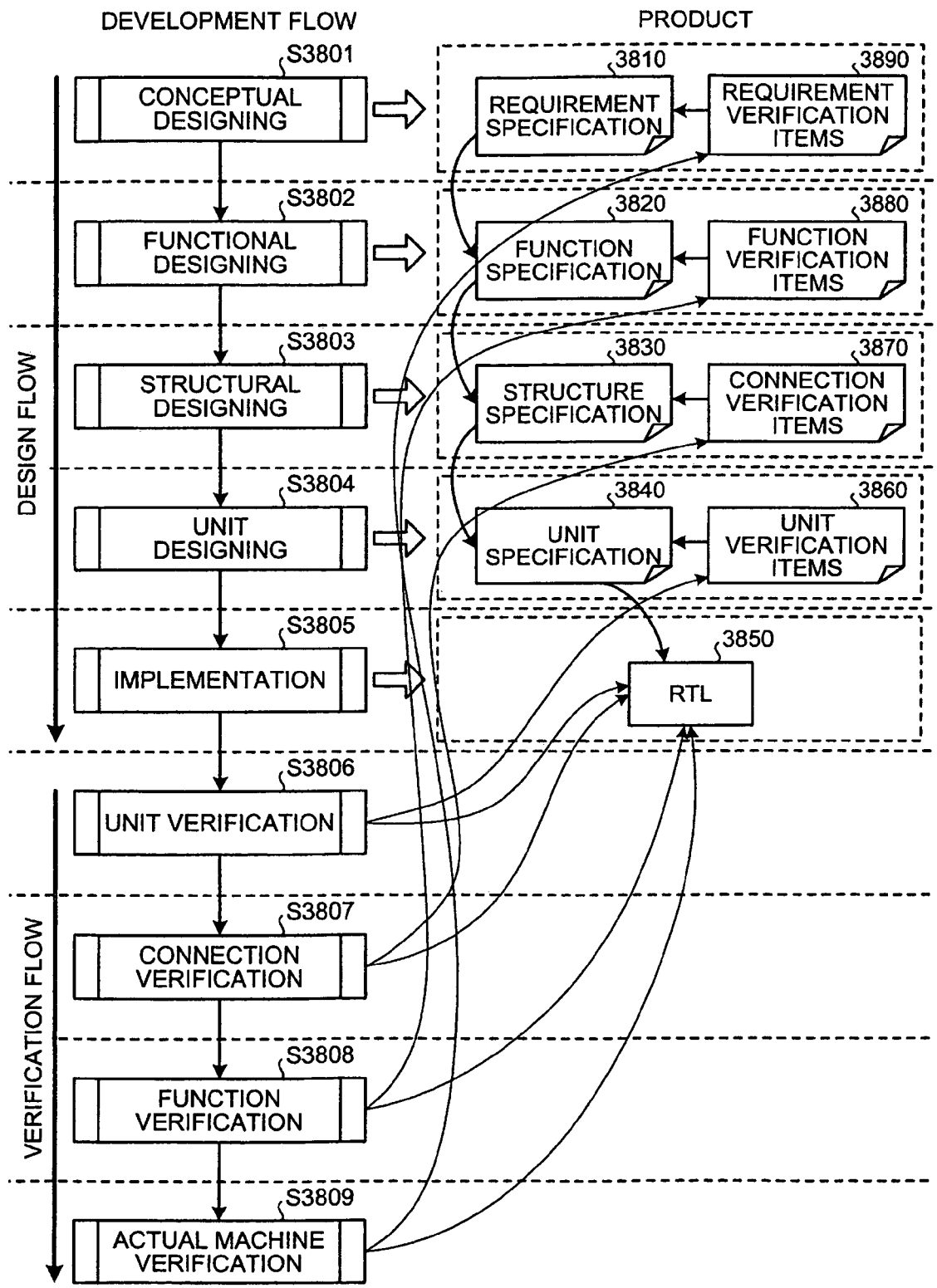
FIG. 38 is a flowchart of a conventional LSI development process.

Next, by this mapping, the design class diagram in the software model is generated (step S3502). FIG. 37 is an explanatory diagram of the design class diagram 3700 in the software model. In FIG. 37, the design class diagram in the software model is generated based on the divided design class diagrams 2210 to 2240 shown in FIG. 22.

The design class diagram 3700 in the software model includes not only the divided design class diagram 3701 regarding the top module, the divided design class diagram 3702 regarding the decoder module, and the divided design class diagram 3703 regarding the encoder module, but also the divided design class diagram 3704 regarding the virtual OS model. The implementation codes of the software model are generated for each of the design class diagrams 3701 to 3704 (step S3503).

Thereafter, at step S517 of FIG. 5, simulation of the implementation codes of the software model is performed. At step S518 of FIG. 5, determination is made as to match of results of simulation of the implementation codes of the software model and results of simulation of the implementation codes of the concept model, and the case of match (step S518: YES) indicates that the results of simulation of the implementation codes of the software model satisfy all of the requirement items 1301 to 1308 of the requirement item list 1300 shown in FIG. 13 and that the task division of the software is proper.

On the other hand, the case of mismatch (step S518: NO) indicates that the results of simulation of the implementation codes of the software model satisfy none of the requirement items 1301 to 1308 of the requirement item list 1300 shown in FIG. 13 and that the task division of the software is not proper.

In this case, at step S519 of FIG. 5, the implementation codes of the software model are modified. In this manner, the accuracy of the task division of the software can be verified.

The verification supporting apparatus and the verification support method according to the embodiment enable avoidance of specification risks at an early stage. Specifically, by analyzing the customer's requirements by UML and using practicable models, it can be verified whether the design can satisfy the function requirements of the customer, misunderstanding or error of specification can be found out at an early stage, and the design of a system LSI based on erroneous specification can be prevented.

The verification supporting apparatus and the verification support method according to the embodiment of the present invention also enable solution of the simulation speed bottleneck. Specifically, conventional verification techniques, which carry out simulation using RTL simulator, have a problem that the simulation speed is very slow, but the present embodiment, which carries out simulation using a model of higher degree of abstraction, enables the simulation at a speed several hundred times as fast as the RTL simulator. Therefore, this enhanced simulation speed enables shortening of the design period including verification work.

The verification supporting apparatus and the verification support method according to the embodiment also enable cost reduction. Specifically, conventional verification techniques necessitate introduction of an expensive emulator in the case of large-scale LSI, but the embodiment of the present invention, because of the verification of a model of high degree of abstraction, enables a significant decrease in frequency of use of emulator and cost reduction. In many cases use of emulator is calculated basically in terms of money per hour and therefore, the shortened verification time can achieve the reduction of cost.

The verification supporting apparatus and the verification support method according to the embodiment shortens the verification process by removing specification errors at early stage.

More effective improvement on conventional techniques is that while the verification process could not be performed before the completion of the RTL in the conventional techniques, verification can be started at an early stage of design according to the embodiment of the present invention. Also, the properness of respective design models can be verified according to the degree of detailedness of the design. As a result, the design process can be significantly shortened, as compared with the conventional technique of the verification start only after the end of the design.

Furthermore, quantitative architecture evaluation can be performed according to the embodiment. Specifically, the conventional techniques have a problem that performance evaluation can not be performed unless the HDL of the RTL has been completed, and it costs very highly to make a design change after the completion of the HDL of the RTL on the ground that the performance is not satisfied.

Contrary to this, according to the embodiment of the present invention, rough performance (motion) estimation can be made with respect to a motion model of a high degree of abstraction by RTL at an early stage, and a risk of not satisfying the performance (motion) can be reduced.

While description has been made using the LSI system including the serial transceiver system as an example in the above specific examples, the present invention is not limited to this particular system LSI but is applicable to a variety of system LSIs.

The verification support method described in the embodiment of the present invention can be realized by executing a program prepared in advance on a computer such as a personal computer, a workstation, and a computer aided design (CAD). This program is recorded on computer-readable recording medium such as an HD, an FD, a CD-ROM, an MO, and a DVD and is executed by being read out from the recording medium by a computer. This program may be in the form of transmission medium that can be distributed through a network such as the Internet.

According to the embodiments described above, it is possible to extract problems at an early stage of development and to avoid the risk caused by the problems. Therefore, it is possible to improve accuracy in LSI design and to shorten a verification period easily and efficiently.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A verification supporting apparatus comprising:
   an analytical information receiving unit that receives analytical information indicative of a result of analysis of a requirement specification regarding a large-scale integration of a design object;
   a concept model generating unit that generates a concept model in which basic functions of the design object are modeled and in which physical architecture of the design object and concept of time are abstracted, based on the analytical information;
   a function model generating unit that generates a function model that is modeled by extracting division of modules making up the design object and concurrence and parallelism of divided modules, based on the analytical information;
   a function model verifying unit that verifies whether the division of modules and the concurrence and the parallelism in the function model are proper based on the concept model;
   a storage unit that stores information on a plurality of kinds of physical architectures;
   an extracting unit that extracts information on an arbitrary architecture from the storage unit when the function model is verified as proper by the function model verifying unit;
   a motion model generating unit that generates a motion model in which motion of the design object is modeled by mapping the information on the architecture extracted by the extracting unit to the function model verified as proper by the function model verifying unit; and
   a motion model verifying unit that verifies whether motion timing of the modules is proper that make up the design object modeled by the motion model.

2. The verification supporting apparatus according to claim 1, further comprising:
   an ICA model generating unit that generates an interface cycle accurate model by inserting, at a place where a degree of abstraction is different between modules making up the design object modeled by the function model, an interface of a predetermined clock cycle accuracy between the modules, when the motion timing is verified as proper; and
   an ICA model verifying unit that verifies whether the clock cycle accuracy of the interface is proper, based on the concept model.

3. The verification supporting apparatus according to claim 1, further comprising:
   a software model generating unit that generates a software model that is modeled so as to include tasks executable by software, based on the design object modeled by the function model, when the motion timing is verified as proper; and
   a software model verifying unit that verifies whether the tasks included in the software model are proper, based on the concept model.

4. A verification support method comprising:
   receiving analytical information indicative of a result of analysis of a requirement specification regarding a large-scale integration of a design object;
   generating a concept model in which basic functions of the design object are modeled and in which physical architecture of the design object and concept of time are abstracted, based on the analytical information;
   generating a function model that is modeled by extracting division of modules making up the design object and concurrence and parallelism of divided modules, based on the analytical information;
   verifying whether the division of modules and the concurrence and the parallelism in the function model are proper based on the concept model;
   extracting information on an arbitrary architecture from among a plurality of kinds of physical architectures when it is verified as proper for the function model at the verifying;
   generating a motion model in which motion of the design object is modeled by mapping the information on the architecture extracted at the extracting to the function model verified as proper; and
   verifying whether motion timing of the modules is proper that make up the design object modeled by the motion model.

5. The verification support method according to claim 4, further comprising:
   generating an interface cycle accurate model by inserting, at a place where a degree of abstraction is different between modules making up the design object modeled by the function model, an interface of a predetermined clock cycle accuracy between the modules, when the motion timing is verified as proper; and
   verifying whether the clock cycle accuracy of the interface is proper, based on the concept model.

6. The verification support method according to claim 4, further comprising:
   generating a software model that is modeled so as to include tasks executable by software, based on the design object modeled by the function model, when the motion timing is verified as proper; and
   verifying whether the tasks included in the software model are proper, based on the concept model.

7. A computer-readable recording medium that stores therein a verification support program that causes a computer to execute:
   receiving analytical information indicative of a result of analysis of a requirement specification regarding a large-scale integration of a design object;

generating a concept model in which basic functions of the design object are modeled and in which physical architecture of the design object and concept of time are abstracted, based on the analytical information;

generating a function model that is modeled by extracting division of modules making up the design object and concurrence and parallelism of divided modules, based on the analytical information;

verifying whether the division of modules and the concurrence and the parallelism in the function model are proper based on the concept model;

extracting information on an arbitrary architecture from among a plurality of kinds of physical architectures when it is verified as proper for the function model at the verifying;

generating a motion model in which motion of the design object is modeled by mapping the information on the architecture extracted at the extracting to the function model verified as proper; and verifying whether motion timing of the modules is proper that make up the design object modeled by the motion model.

8. The computer-readable recording medium according to claim 7, wherein the verification support program further causes the computer to execute:

generating an interface cycle accurate model by inserting, at a place where a degree of abstraction is different between modules making up the design object modeled by the function model, an interface of a predetermined clock cycle accuracy between the modules, when the motion timing is verified as proper; and verifying whether the clock cycle accuracy of the interface is proper, based on the concept model.

9. The computer-readable recording medium according to claim 7, wherein the verification support program further causes the computer to execute:

generating a software model that is modeled so as to include tasks executable by software, based on the design object modeled by the function model, when the motion timing is verified as proper; and verifying whether the tasks included in the software model are proper, based on the concept model.

* * * * *